United States Patent
Hatakeyama et al.

(10) Patent No.: US 10,544,272 B2
(45) Date of Patent: *Jan. 28, 2020

(54) STRETCHABLE FILM AND METHOD FOR FORMING THE SAME, METHOD FOR MANUFACTURING COATED WIRING SUBSTRATE, AND STRETCHABLE WIRING FILM AND METHOD FOR MANUFACTURING THE SAME

(71) Applicant: SHIN-ETSU CHEMICAL CO., LTD., Tokyo (JP)

(72) Inventors: Jun Hatakeyama, Jyoetsu (JP); Motoaki Iwabuchi, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 158 days.

This patent is subject to a terminal disclaimer.

(21) Appl. No.: 15/496,765

(22) Filed: Apr. 25, 2017

(65) Prior Publication Data
US 2017/0335076 A1    Nov. 23, 2017

(30) Foreign Application Priority Data
May 19, 2016    (JP) ................. 2016-100539

(51) Int. Cl.
*H01B 5/16*    (2006.01)
*C08J 5/18*    (2006.01)
*C08F 220/34*    (2006.01)

(52) U.S. Cl.
CPC .............. *C08J 5/18* (2013.01); *C08F 220/34* (2013.01); *H01B 5/16* (2013.01); *C08F 2220/343* (2013.01); *C08J 2333/14* (2013.01)

(58) Field of Classification Search
CPC .... H01L 24/85; H05K 1/0283; H05K 1/0326; H05K 2201/0133; H05K 2220/343; H01B 5/16; C08J 5/18; C08J 2333/14; C08F 220/34
See application file for complete search history.

(56) References Cited

U.S. PATENT DOCUMENTS

| 5,549,999 | A * | 8/1996 | Swain et al. | ............. B05D 7/04 156/158 |
| 9,403,990 | B2 * | 8/2016 | Takashima et al. | ........................... C08G 18/672 |
| 2011/0048261 | A1 | 3/2011 | Shimura | |
| 2013/0089734 | A1 | 4/2013 | Nakamura et al. | |
| 2015/0004406 | A1 | 1/2015 | Suzuki et al. | |
| 2017/0015817 | A1 | 1/2017 | Yoda et al. | |
| 2018/0118915 | A1 * | 5/2018 | Hatakeyanna et al. | ............... C01B 33/24 |
| 2018/0134860 | A1 * | 5/2018 | Hatakeyama | .............. C08J 5/18 |

FOREIGN PATENT DOCUMENTS

| JP | H5-278166 | A | 10/1993 |
| JP | 2000-086429 | A | 3/2000 |
| JP | 2001-278918 | A | 10/2001 |
| JP | 2001-296695 | A | 10/2001 |
| JP | 2004-033468 | A | 2/2004 |
| JP | 2005-320418 | A | 11/2005 |
| JP | 2006-077200 | A | 3/2006 |
| JP | 3865622 | B2 | 1/2007 |
| JP | 2011-194757 | | 10/2011 |
| JP | 2012-211236 | A | 11/2012 |
| JP | 2013-136662 | A | 7/2013 |
| JP | 2013-139534 | A | 7/2013 |
| JP | 2014-001341 | A | 1/2014 |
| JP | 5495799 | B2 | 5/2014 |
| JP | 2015-196748 | A | 11/2015 |
| TW | 201204552 | A1 | 2/2012 |
| WO | 2016/047291 | A1 | 3/2016 |
| WO | WO2015/152289 | A1 | 4/2017 |

OTHER PUBLICATIONS

Mar. 14, 2018 Search Report issued in Taiwanese Patent Application 106116222.
Mar. 14, 2018 Office Action issued in Taiwanese Patent Application No. 106116222.
Sep. 18, 2018 Office Action issued in Korean Patent Application No. 2017-0061080.
Mar. 26, 2019 Office Action issued in Japanese Patent Application No. 2016-100539.

* cited by examiner

*Primary Examiner* — Nathan M Nutter
(74) *Attorney, Agent, or Firm* — Oliff PLC

(57) ABSTRACT

The present invention provides a stretchable film including: a cured product of a composition which contains (A) a (meth)acrylate compound having a siloxane bond, (B) a (meth)acrylate compound other than the component (A) having a urethane bond, and (C) an organic solvent having a boiling point in the range of 115 to 200° C. at atmospheric pressure; wherein the component (A) is localized in the direction of a surface of the film. The stretchable film of the present invention is excellent in stretchability and strength as well as repellency on the film surface.

20 Claims, 5 Drawing Sheets

STRETCHABLE FILM AND METHOD FOR FORMING THE SAME, METHOD FOR MANUFACTURING COATED WIRING SUBSTRATE, AND STRETCHABLE WIRING FILM AND METHOD FOR MANUFACTURING THE SAME

TECHNICAL FIELD

The present invention relates to a stretchable film that combine stretchability, strength, and repellency, and a method for forming the same; a method for manufacturing a coated wiring substrate in which one side of the conductive wiring on the substrate is coated with the stretchable film; and a stretchable wiring film in which the both sides of the conductive wiring are coated with the stretchable films, and a method for manufacturing the same.

BACKGROUND ART

In recent years, wearable devices have been developed progressively with the spread of Internet of Things (IoT). Representative examples thereof include a watch and glasses that can be connected with internet. Wearable devices that can always monitor physical conditions are also necessary in a medical field and a sports field, and is expected to be a growth field in the future.

Wearable devices include a form that is adhered to a body to monitor physical conditions constantly. Such a wearable device is generally composed of a bio-electrode to detect electric signals from a body, wiring to send electric signals to a sensor, a semiconductor chip to be a sensor, and a battery. Normally, an adhesive pad is necessary to be adhered to skin. The structure of a bio-electrode, wiring around the same, and an adhesive pad are specifically described in Patent Document 1. In the wearable device described in Patent Document 1, a silicone based adhesive film is disposed around the bio-electrode, and the bio-electrode is connected with a sensor device by stretchable silver wiring in the shape of bellows coated with a stretchable urethane film.

Urethane films have high stretchability and strength to possess excellent mechanical properties as coating films for stretchable wiring. The urethane film, however, has hydrolytic properties to cause a disadvantage of lowering the stretchability and the strength due to hydrolysis. On the other hand, silicone films are free from hydrolytic properties, but has a disadvantage of lower strength.

Accordingly, it has been conducted to investigate silicone-urethane polymers with each molecule having both of a urethane bond and a siloxane bond. The cured product of this polymer has higher strength than single silicone, and lower hydrolytic properties than single polyurethane. The cured product of this polymer, however, fails to equal the strength of single polyurethane and the repellency of single silicone, only giving strength and repellency in the middle of those of silicone and polyurethane.

On the other hand, a material in which polyurethane and silicone are blended has been investigated. For example, Patent Document 2 and Patent Document 3 describe a material in which non-reactive silicone and crosslinkable polyurethane are blended. In a film formed from such a material, silicone comes up to the surface of a cured polyurethane film (bleed out) to improve the repellency of the film surface. In such a film, however, the silicone is not crosslinked, which causes peeling of silicone on the film surface to be tend to lower the repellency.

Patent Document 4 describes a material in which crosslinkable urethane-acrylate and silicone-acrylate are blended. This material can improve the heat resistance by blending silicone-acrylate, and can form a cured product with higher strength and adhesiveness by blending urethane-acrylate. In this material, however, a solvent is not blended. Patent Document 5 describes a material in which crosslinkable urethane-acrylate, silicone-urethane-acrylate, and a solvent having low boiling point such as ethanol and methanol. In this material, however, the ratio of the silicone-urethane-acrylate is high relative to the ratio of the urethane-acrylate. Patent Document 6 also describes a material in which crosslinkable urethane-acrylate and silicone-urethane-acrylate are blended. In this material, however, a solvent is not blended.

As described above, the materials in which crosslinkable urethane-acrylate and silicone-(urethane)-acrylate are blended have been investigated previously. In the cured products of these materials, however, the urethane-acrylate and the silicone-(urethane)-acrylate are cured with the both being dispersed uniformly with each other. Accordingly, they can only give intermediate strength and repellency between those of silicone and polyurethane.

Patent Document 7 describes a material in which crosslinkable urethane-acrylate, silicone-urethane-acrylate, and a crosslinkable solvent are blended. In curing of material like this, however, the crosslinkable solvent, containing a polymerizable double bond, crosslinks simultaneously with crosslinking of the urethane-acrylate and the silicone-urethane-acrylate, which cause curing with the urethane-acrylate and the silicone-urethane-acrylate being dispersed uniformly with each other. Accordingly, the cured product only gives intermediate strength and repellency between those of silicone and polyurethane. Moreover, 2-ethylhexylacrylate, which is used as the crosslinkable solvent, has a boiling point above 200° C. to cause slower evaporation rate.

PRIOR ART DOCUMENTS

Patent Documents

Patent Document 1: Japanese Unexamined Patent publication (Kokai) No. 2004-033468
Patent Document 2: Japanese Unexamined Patent publication (Kokai) No. 2011-194757
Patent Document 3: Japanese Unexamined Patent publication (Kokai) No. 2013-139534
Patent Document 4: Japanese Unexamined Patent publication (Kokai) No. 2005-320418
Patent Document 5: Japanese Patent No. 3865622
Patent Document 6: Japanese Patent No. 5495799
Patent Document 7: Japanese Unexamined Patent publication (Kokai) No. H05-278166

SUMMARY OF INVENTION

Technical Problem

In view of these backgrounds, it has been demanded for developing a stretchable film that has excellent stretchability and strength equal to those of polyurethane, with the film surface having excellent repellency equal to that of silicone, and a method for forming the same.

The present invention has been accomplished to solve the foregoing problems, and an object thereof is to provide a stretchable film that has excellent stretchability and strength, with the film surface having excellent repellency, and a method for forming the same. It is also an object of the present invention to provide a method for manufacturing a coated wiring substrate by using such a stretchable film; as well as a stretchable wiring film and a method for manufacturing the same.

Solution to Problem

To achieve the object, the present invention provides a stretchable film comprising:
a cured product of a composition which contains (A) a (meth)acrylate compound having a siloxane bond, (B) a (meth)acrylate compound other than the component (A) having a urethane bond, and (C) an organic solvent having a boiling point in the range of 115 to 200° C. at atmospheric pressure;
wherein the component (A) is localized in the direction of a surface of the film.

Such a stretchable film can be a stretchable film that has excellent stretchability and strength, which film surface is excellent in repellency.

The ratio of the component (A) is preferably in the range of 1 to 35% by mass based on the total mass of solid contents in the composition excluding the component (C).

When the component (A) is in such a range, it is possible to localize sufficient amount of the component (A) in the direction of a surface of the stretchable film to make the repellency on the surface of the stretchable film have more preferable. Since the amount of the component (A) is appropriate, and the ratio of the component (B) is not too low, the stretchable film comes to have more preferable strength and is also free from the risk of generating agglomerates of the component (A) to cause a layer separation structure with a mottled pattern.

It is preferable that the component (A) be a compound shown by the following general formula (1-1), (1-2), or (1-3); and the component (B) be a compound shown by the following general formula (2):

wherein $R^1$, $R^2$, $R^6$, $R^7$, $R^8$, $R^9$, $R^{14}$, $R^{15}$, and $R^{16}$ each represent a hydrogen atom, a trimethylsilyloxy group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{10}$ represents a hydrogen atom, a trimethylsilyl group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{15}$ and $R^{16}$ optionally bond with each other to form a ring, in which $R^{15}$ and $R^{16}$ form an ether group together; $R^9$ and $R^{10}$ optionally bond with each other to form a ring, in which $R^9$ and $R^{10}$ form a single bond; $R^3$, $R^{11}$, and $R^{17}$ each represent a linear, branched, or cyclic alkylene group having 3 to 30 carbon atoms optionally containing an ether group; $R^4$, $R^{12}$, and $R^{18}$ each represent a single bond, a linear, branched, or cyclic alkylene group having 1 to 20 carbon atoms, or an arylene group having 6 to 20 carbon atoms, optionally containing one or more species selected from an ether group, an ester group, a carbonate group, a carbamate group, an amide group, a urea group, a hydroxy group, and a thiourethane bond; $R^5$, $R^{13}$, $R^{19}$, and $R^{23}$ each represent a hydrogen atom or a methyl group; $R^{20}$ and $R^{22}$ each represent a single bond, a linear, branched, or cyclic alkylene group having 1 to 20 carbon atoms, an arylene group having 6 to 20 carbon atoms, or an alkenylene group having 2 to 20 carbon atoms, optionally containing one or more groups selected from an ether group, an ester group, aryl groups, and arylene groups; $R^{21}$ represents a single bond or a divalent hydrocarbon group having 1 to 15 carbon atoms; X represents a single bond, or a divalent hydrocarbon group having 1 to 12 carbon atoms optionally containing one or (1-1)

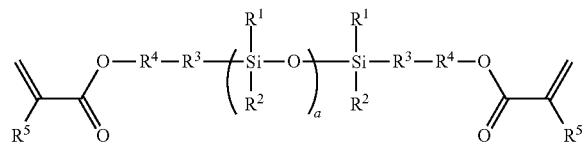

(1-2)

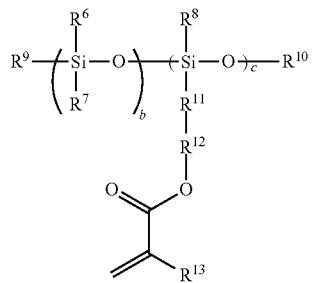

(1-3)

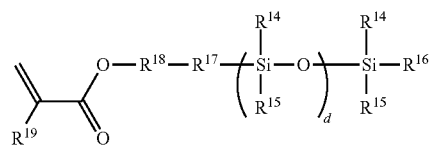

(2)

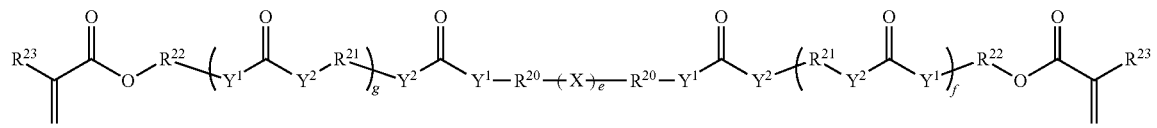

more groups selected from an ether group, an ester group, and a carbonate group; either $Y^1$ or $Y^2$ represents an oxygen atom and the other represents a NH group; "a" and "d" are each an integer of 1 to 100; "b" is an integer of 0 to 100, "c" is an integer of 1 to 100, and b+c is 1 to 100; "e" is an integer of 1 to 100; "f" is an integer of 0 to 200; and "g" is an integer of 0 to 200.

Such a component (A) and component (B) further improve the stretchability and the strength of the stretchable film as well as the repellency of the film surface.

The component (C) is preferably one or more organic solvents selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, and propylene glycol monoethyl ether acetate.

Such a component (C), having a boiling point in the foregoing range, is particularly suitable for the inventive stretchable film.

The stretchable film preferably has a stretching property of 40 to 300% regulated by JIS C 2151.

With such a stretching property, the stretchable film can be particularly preferably used as a coating film of a stretchable wiring.

The stretchable film is preferably used as a film for covering a conductive wiring having stretchability.

The inventive stretchable film is particularly suitable for such a use.

The present invention also provides a method for forming a stretchable film comprising:

applying a composition which contains (A) a (meth)acrylate compound having a siloxane bond, (B) a (meth)acrylate compound other than the component (A) having a urethane bond, and (C) an organic solvent having a boiling point in the range of 115 to 200° C. at atmospheric pressure onto a substrate;

evaporating the component (C) by heating, while localizing the component (A) in the direction of a surface of the film; and thereafter curing the component (A) and the component (B) by light irradiation.

Such a method makes it possible to easily form a stretchable film that has excellent stretchability and strength, which film surface is excellent in repellency.

It is preferable that the ratio of the component (A) be in the range of 1 to 35% by mass based on the total mass of solid contents in the composition excluding the component (C).

When the component (A) is set to such a range, it is possible to localize sufficient amount of the component (A) in the direction of a surface of the stretchable film to make the repellency on the surface of the stretchable film more preferable. Since the amount of the component (A) is appropriate, and the ratio of the component (B) is not too low, the stretchable film can have more preferable strength and is free from the risk of generating agglomerates of the component (A) to cause a layer separation structure with a mottled pattern.

It is also preferable that the component (A) be a compound shown by the following general formula (1-1), (1-2), or (1-3); and the component (B) be a compound shown by the following general formula (2):

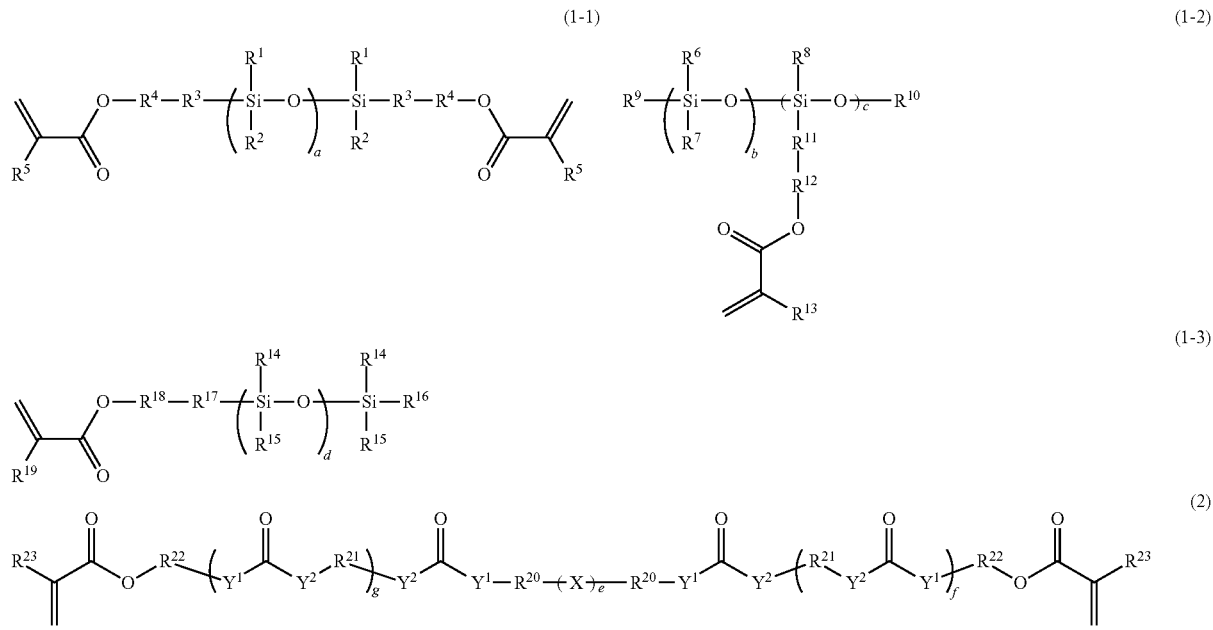

wherein $R^1$, $R^2$, $R^6$, $R^7$, $R^8$, $R^9$, $R^{14}$, $R^{15}$, and $R^{16}$ each represent a hydrogen atom, a trimethylsilyloxy group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{10}$ represents a hydrogen atom, a trimethylsilyl group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{15}$ and $R^{16}$ optionally bond with each other to form a ring, in which $R^{15}$ and $R^{16}$ form an ether group together; $R^9$ and $R^{10}$ optionally bond with each other to form a ring, in which $R^9$ and $R^{10}$ form a single bond; $R^3$, $R^{11}$, and $R^{17}$ each represent a linear, branched, or cyclic alkylene group having 3 to 30 carbon atoms optionally containing an ether group; $R^4$, $R^{12}$, and $R^{18}$ each represent a single bond, a linear, branched, or cyclic alkylene group having 1 to 20 carbon atoms, or an arylene group having 6 to 20 carbon atoms, optionally containing one or more species selected from an ether group, an ester group, a carbonate group, a carbamate group, an amide group, a urea group, a hydroxy group, and a thiourethane bond; $R^5$, $R^{13}$, $R^{19}$, and $R^{23}$ each represent a hydrogen atom or a methyl group; $R^{20}$ and $R^{22}$ each represent a single bond, a linear, branched, or cyclic alkylene group having 1 to 20 carbon atoms, an arylene group having 6 to 20 carbon atoms, or an alkenylene group having 2 to 20 carbon atoms, optionally containing one or more groups selected from an ether group, an ester group, aryl groups, and arylene groups; $R^{21}$ represents a single bond or a divalent hydrocarbon group having 1 to 15 carbon atoms; X represents a single bond, or a divalent hydrocarbon group having 1 to 12 carbon atoms optionally containing one or more groups selected from an ether group, an ester group, and a carbonate group; either $Y^1$ or $Y^2$ represents an oxygen atom and the other represents a NH group; "a" and "d" are each an integer of 1 to 100; "b" is an integer of 0 to 100, "c" is an integer of 1 to 100, and b+c is 1 to 100; "e" is an integer of 1 to 100; "f" is an integer of 0 to 200; and "g" is an integer of 0 to 200.

By using such a component (A) and a component (B), it is possible to form a stretchable film with more preferable stretchability, strength, and the repellency of the film surface.

As the component (C), it is preferable to use one or more organic solvents selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, and propylene glycol monoethyl ether acetate.

Such a component (C), having a boiling point in the foregoing range, is particularly suitable for the inventive method for forming a stretchable film.

The present invention also provides a stretchable wiring film, comprising a conductive wiring having stretchability, the both sides of the conductive wiring being coated with the foregoing stretchable film; wherein the surface localizing the component (A) of the stretchable film is disposed on the outside, and the conductive wiring is disposed on the inside.

Such a stretchable wiring film, with the both sides of the conductive wiring being coated with the inventive stretchable film, has a surface with excellent repellency not only has excellent stretchability and strength.

The present invention also provides a method for manufacturing a stretchable wiring film, comprising:

sandwiching a conductive wiring having stretchability between two stretchable films described above, with the surface where the component (A) localizes being disposed on the outside; and laminating the conductive wiring and the stretchable films by heating and pressing to coat the both sides of the conductive wiring.

Such a manufacturing method, coating the both sides of a conductive wiring with the inventive stretchable films, makes it possible to easily manufacture a stretchable wiring film that has a surface with excellent repellency not only has excellent stretchability and strength.

The present invention also provides a method for manufacturing a coated wiring substrate having a single-side-coated conductive wiring, comprising:

putting a conductive wiring having stretchability onto a substrate;

applying a composition which contains (A) a (meth) acrylate compound having a siloxane bond, (B) a (meth) acrylate compound other than the component (A) having a urethane bond, and (C) an organic solvent having a boiling point in the range of 115 to 200° C. at atmospheric pressure onto the substrate having the conductive wiring thereon;

evaporating the component (C) by heating, while localizing the component (A) in the direction of a surface of the film; and thereafter curing the component (A) and the component (B) by light irradiation to form a stretchable film.

Such a manufacturing method makes it possible to easily manufacture a coated wiring substrate in which one side of the conductive wiring is coated with the inventive stretchable film, which has excellent stretchability and strength, with the film surface being excellent in repellency. The coated wiring substrate thus formed can be suitably used for manufacturing a stretchable wiring film.

The present invention also provides a method for manufacturing a stretchable wiring film having a double-side-coated conductive wiring, comprising:

removing the single-side-coated conductive wiring temporarily from the substrate of the coated wiring substrate manufactured by the foregoing method;

putting the single-side-coated conductive wiring onto the substrate, with the coated side being downward;

applying a composition which contains the component (A), the component (B), and the component (C) onto the substrate having the single-side-coated conductive wiring thereon;

evaporating the component (C) by heating, while localizing the component (A) in the direction of a surface of the film; and thereafter curing the component (A) and the component (B) by light irradiation to form a stretchable film.

Such a manufacturing method, coating the both sides of a conductive wiring with the inventive stretchable films, makes it possible to easily manufacture a stretchable wiring film that has a surface with excellent repellency not only has excellent stretchability and strength.

Advantageous Effects of Invention

As described above, the inventive stretchable film can be a stretchable film that has excellent stretchability and strength equal to those of polyurethane, which film surface is excellent in repellency equal to that of silicone. In the inventive stretchable film, (A) the (meth)acrylate compound having a siloxane bond localized in the direction of the film surface is crosslinked, and is free from the risk of peeling of silicone on the film surface to lower the repellency unlike a film in which silicone is bled out to the surface. The inventive method for forming a stretchable film makes it possible to easily form a stretchable film that has excellent stretchability and strength equal to those of polyurethane, with the film surface having excellent repellency equal to that of silicone. The inventive stretchable wiring film, in which the both sides of a conductive wiring are coated with such stretchable films, has a surface with excellent repellency not only has excellent stretchability and strength. Accordingly, the inventive stretchable wiring film can be particularly suitably used as a wiring unit to connect the bio-electrode and the sensor in a wearable device. The inventive manufacturing methods make it possible to easily manufacture a stretchable wiring film and a coated wiring substrate by using such a stretchable film.

DESCRIPTION OF EMBODIMENTS

Figure 1A:
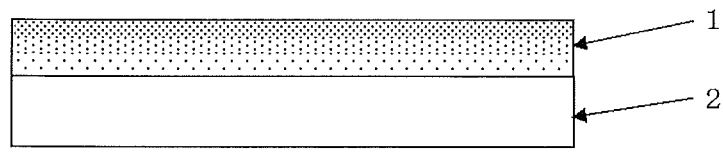
FIG. 1A is a schematic drawing showing an example of the inventive stretchable film formed on the substrate.

As described above, the polyurethane has sufficient stretchability and strength, but has a disadvantage of lower repellency to cause lowering of the strength and the stretchability due to hydrolysis; the silicone has higher repellency, but has a disadvantage of lower strength. In the cured product of silicone-urethane polymer having the both of a urethane bond and a siloxane bond, the strength and the repellency are intermediate between those of polyurethane and silicone, which fail to equal to the strength of single polyurethane and the repellency of single silicone. In view of these backgrounds, it has been demanded for developing a stretchable film that has excellent stretchability and strength equal to those of polyurethane, with the film surface having excellent repellency equal to that of silicone, and a method for forming the same.

The present inventors have diligently investigated to solve the foregoing subject. As a result, the inventors have found that a stretchable film comprising the both of a (meth) acrylate compound having a siloxane bond with excellent repellency and a (meth)acrylate compound having a urethane bond with excellent stretchability and strength, in which the (meth)acrylate compound having a siloxane bond with excellent repellency is localized in the direction of the film surface, can be a stretchable film that has excellent stretchability and strength equal to those of polyurethane, with the film surface having excellent repellency equal to that of silicone, and is particularly suitable as a coating film of stretchable wiring in a wearable device; thereby completing the present invention.

That is, the present invention is a stretchable film comprising:

a cured product of a composition which contains (A) a (meth)acrylate compound having a siloxane bond, (B) a (meth)acrylate compound other than the component (A) having a urethane bond, and (C) an organic solvent having a boiling point in the range of 115 to 200° C. at atmospheric pressure;

wherein the component (A) is localized in the direction of a surface of the film.

Hereinafter, the present invention will be specifically described, but the present invention is not limited thereto.

<Stretchable Film>

The inventive stretchable film is a cured product of a composition which contains (A) a (meth)acrylate compound having a siloxane bond, (B) a (meth)acrylate compound other than the component (A) having a urethane bond, and (C) an organic solvent having a boiling point in the range of 115 to 200° C. at atmospheric pressure. Hereinafter, each components contained in the composition for forming the inventive stretchable film will be described more specifically.

[(A) (Meth)Acrylate Compound Having Siloxane Bond]

The composition for forming the inventive stretchable film contains a (meth)acrylate compound having a siloxane bond as the component (A). Herein, the (meth)acrylate compound having a siloxane bond represents a methacrylate compound having a siloxane bond or an acrylate compound having a siloxane bond. It is more preferable that the component (A) be a silicone-(meth)acrylate resin.

As the component (A), a compound shown by the following general formula (1-1), (1-2), or (1-3) is preferable. Such a component (A) makes the repellency on the surface of the stretchable film more preferable.

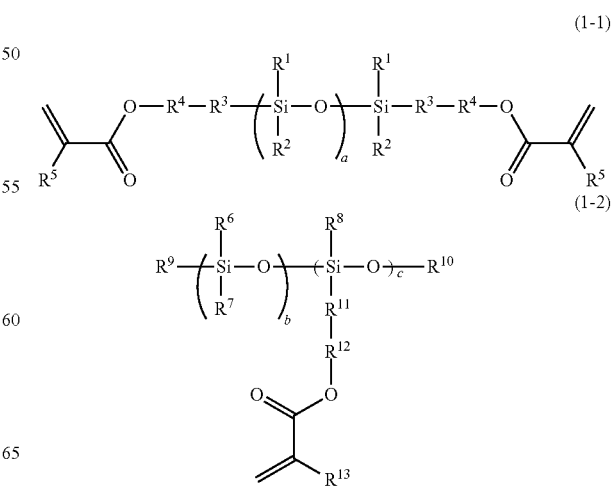

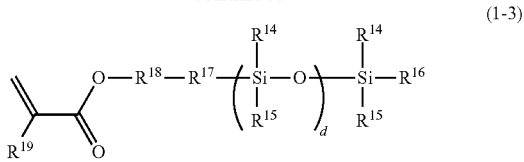

(1-3)

In the formula, $R^1$, $R^2$, $R^6$, $R^7$, $R^8$, $R^9$, $R^{14}$, $R^{15}$, and $R^{16}$ each represent a hydrogen atom, a trimethylsilyloxy group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{10}$ represents a hydrogen atom, a trimethylsilyl group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{15}$ and $R^{16}$ optionally bond with each other to form a ring, in which $R^{15}$ and $R^{16}$ form an ether group together; $R^9$ and $R^{10}$ optionally bond with each other to form a ring, in which $R^9$ and $R^{10}$ form a single bond; $R^3$, $R^{11}$, and $R^{17}$ each represent a linear, branched, or cyclic alkylene group having 3 to 30 carbon atoms optionally containing an ether group; $R^4$, $R^{12}$, and $R^{18}$ each represent a single bond, a linear, branched, or cyclic alkylene group having 1 to 20 carbon atoms, or an arylene group having 6 to 20 carbon atoms, optionally containing one or more species selected from an ether group, an ester group, a carbonate group, a carbamate group, an amide group, a urea group, a hydroxy group, and a thiourethane bond; $R^5$, $R^{13}$, and $R^{19}$ each represent a hydrogen atom or a methyl group; "a" and "d" are each an integer of 1 to 100; "b" is an integer of 0 to 100, "c" is an integer of 1 to 100, and b+c is 1 to 100.

Each of $R^1$, $R^2$, $R^6$, $R^7$, $R^8$, $R^9$, $R^{14}$, $R^{15}$, and $R^{16}$ represents a hydrogen atom, a trimethylsilyloxy group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, each of which may contain one or more species selected from a hydroxy group, alkoxy groups, an amino group, and halogen atoms. As $R^1$, $R^2$, $R^6$, $R^7$, $R^8$, $R^9$, $R^{14}$, $R^{15}$, and $R^{16}$, a hydrogen atom, a methyl group, an ethyl group, an n-propyl group, an isopropyl group, an n-butyl group, an isobutyl group, a 3,3,3-trifluoropropyl group, a phenyl group, a naphthyl group, a vinyl group, an allyl group, an ethynyl group, etc. are particularly preferable.

$R^{10}$ represents a hydrogen atom, a trimethylsilyl group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, each of which may contain one or more species selected from a hydroxy group, alkoxy groups, an amino group, and halogen atoms. As $R^{10}$, a hydrogen atom, a methyl group, an ethyl group, an n-propyl group, a trimethylsilyl group, etc. are particularly preferable.

It is to be noted that $R^{15}$ and $R^{16}$ may bond with each other to form a ring, in which $R^{15}$ and $R^{16}$ form an ether group together; $R^9$ and $R^{10}$ may bond with each other to form a ring, in which $R^9$ and $R^{10}$ form a single bond.

Each of $R^3$, $R^{11}$, and $R^{17}$ represents a linear, branched, or cyclic alkylene group having 3 to 30 carbon atoms, and may contain an ether group. As $R^3$, $R^{11}$, and $R^{17}$, a propylene group, a butylene group, a pentylene group, a heptylene group, a cyclohexylene group, etc. are particularly preferable.

Each of $R^4$, $R^{12}$, and $R^{18}$ represents a single bond, a linear, branched, or cyclic alkylene group having 1 to 20 carbon atoms, or an arylene group having 6 to 20 carbon atoms, each of which may contain one or more species selected from an ether group, an ester group, a carbonate group, a carbamate group, an amide group, a urea group, a hydroxy group, and a thiourethane bond. As $R^4$, $R^{12}$, and $R^{18}$, the following groups, etc. are particularly preferable.

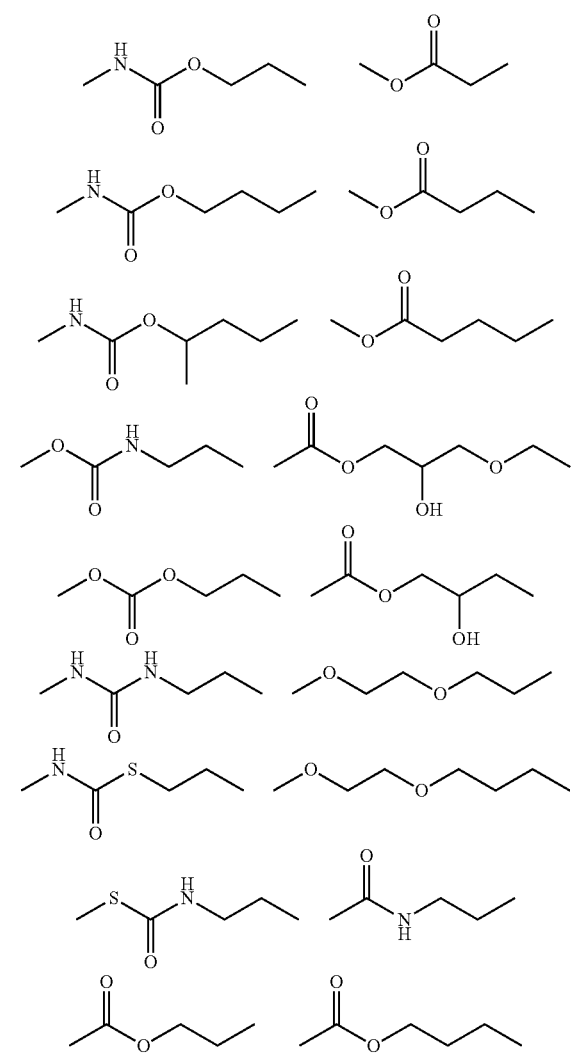

Each of $R^5$, $R^{13}$, and $R^{19}$ represents a hydrogen atom or a methyl group. Incidentally, when $R^5$, $R^{13}$, and $R^{19}$ each represent a hydrogen atom, each formula represents an acrylate compound; when $R^5$, $R^{13}$, and $R^{19}$ each represent a methyl group, each formula represents a methacrylate compound.

Each of "a" and "d" is an integer of 1 to 100, preferably 1 to 30; "b" is an integer of 0 to 100, preferably 0 to 30, "c" is an integer of 1 to 100, preferably 1 to 10, and b+c is 1 to 100, preferably 2 to 30.

The silicone-(meth)acrylate compound shown by the general formula (1-1) can be obtained by a method of reacting siloxane having hydroxy groups at the both ends with (meth)acrylic anhydride or (meth)acryloyl chloride; a method of reacting siloxane having hydroxy groups at the both ends with (meth)acrylate compounds each having an isocyanate group; a method of reacting siloxane having isocyanate groups at the both ends with (meth)acrylate compounds each having a hydroxy group; a method of reacting siloxane having carboxy groups at the both ends with (meth)acrylate compounds each having an epoxy group or a hydroxy group, which are reactive to the carboxy group; a method of reacting siloxane having amino groups at the both ends with (meth)acrylate compounds each having an isocyanate group, a hydroxy group, or a carboxy group; etc.

The silicone (meth)acrylate compound shown by the general formula (1-2) can be obtained by the same method as the method for synthesizing the silicone-(meth)acrylate compound shown by the general formula (1-1) except for using siloxane having a reactive group(s) such as a hydroxy group, a carboxy group, an epoxy group, and an amino group at the side chain not the both ends.

The silicone (meth)acrylate compound shown by the general formula (1-3) can be obtained by the same method as the method for synthesizing the silicone-(meth)acrylate compound shown by the general formula (1-1) except for using siloxane having a reactive group such as a hydroxy group, a carboxy group, an epoxy group, and an amino group at the one end not the both ends. Illustrative examples of the silicone-(meth)acrylate compound shown by the general formula (1-3) include compounds which are polymerized to be structures shown by Si-2 to Si-5 in paragraph (0023) in Japanese Unexamined Patent publication (Kokai) No. 2001-278918.

The ratio of the component (A) is preferably in the range of 1 to 35% by mass, more preferably in the range of 1.2 to 30% by mass, particularly in the range of 1.5 to 25% by mass based on the total mass of solid contents in the composition excluding the component (C) that will be described below. When the amount is 1% by mass or more, the component (A) localizes in the direction of the surface of the stretchable film in sufficient amount, which further improves the repellency of the surface of the stretchable film. When the amount is 30% by mass or less, the amount of the component (A) is appropriate without overly lowering the ratio of the component (B), which further improves the strength of the stretchable film and is also free from the risk to generate aggregates of the component (A) on the film surface after baking to form a layer separated structure having a mottled pattern.

[(B) (Meth)Acrylate Compound Other than Component (A) Having Urethane Bond]

The composition for forming the inventive stretchable film contains a (meth)acrylate compound other than the component (A) having a urethane bond as the component (B). Herein, the (meth)acrylate compound having a urethane bond represents a methacrylate compound having a urethane bond or an acrylate compound having a urethane bond. The component (B) is preferably urethane-(meth)acrylate resin.

As the component (B), the compounds shown by the following general formula (2) are preferable. Such a component (B) further improves the stretchability and the strength of the stretchable film.

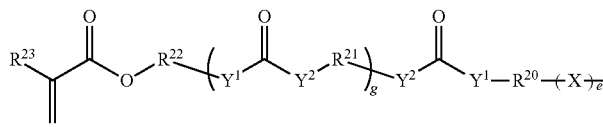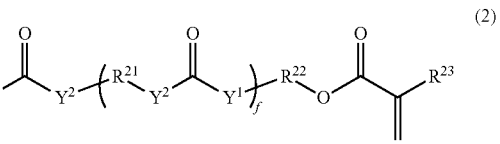

(2)

In the formula, $R^{23}$ represents a hydrogen atom or a methyl group; $R^{20}$ and $R^{22}$ each represent a single bond, a linear, branched, or cyclic alkylene group having 1 to 20 carbon atoms, an arylene group having 6 to 20 carbon atoms, or an alkenylene group having 2 to 20 carbon atoms, each of which may contain one or more groups selected from an ether group, an ester group, aryl groups, and arylene groups; $R^{21}$ represents a single bond or a divalent hydrocarbon group having 1 to 15 carbon atoms; X represents a single bond, or a divalent hydrocarbon group having 1 to 12 carbon atoms which may contain one or more groups selected from an ether group, an ester group, and a carbonate group; either $Y^1$ or $Y^2$ represents an oxygen atom and the other represents a NH group; "e" is an integer of 1 to 100; "f" is an integer of 0 to 200; and "g" is an integer of 0 to 200.

$R^{23}$ represents a hydrogen atom or a methyl group. Incidentally, when $R^{23}$ represents a hydrogen atom, this formula represents an acrylate compound; when $R^{23}$ represents a methyl group, this formula represents a methacrylate compound.

Each of $R^{20}$ and $R^{22}$ represents a single bond, a linear, branched, or cyclic alkylene group having 1 to 20 carbon atoms, an arylene group having 6 to 20 carbon atoms, or an alkenylene group having 2 to 20 carbon atoms, each of which may contain one or more groups selected from an ether group, an ester group, aryl groups, and arylene groups. As $R^{20}$ and $R^{22}$, a methylene group, an ethylene group, a propylene group, a butylene group, and a pentylene group, etc. are particularly preferable.

$R^{21}$ represents a single bond or a divalent hydrocarbon group having 1 to 15 carbon atoms. As $R^{21}$, methylene group, an ethylene group, a propylene group, a butylene group, and a pentylene group, etc. are particularly preferable.

X represents a single bond, or a divalent hydrocarbon group having 1 to 12 carbon atoms which may contain one or more groups selected from an ether group, an ester group, and a carbonate group. As X, the following groups, etc. are particularly preferable.

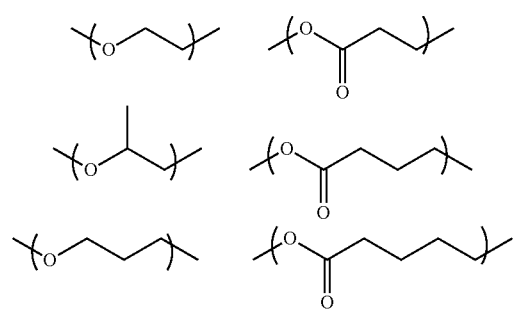

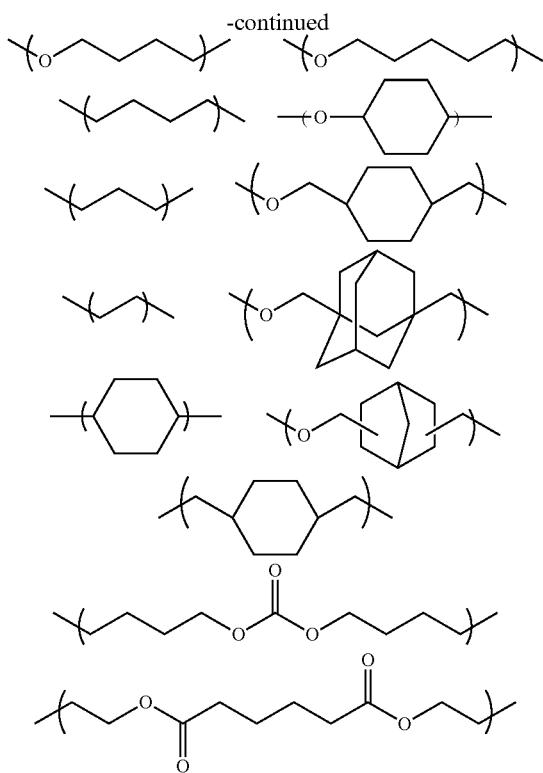

Either $Y^1$ or $Y^2$ represents an oxygen atom and the other represents a NH group. Incidentally, this means that the moiety of a pair of $Y^1$ and $Y^2$ including a carbonyl group in the formula is a urethane bond with the one side being an oxygen atom and the other being an NH group.

In the foregoing formula, "e" is an integer of 1 to 100, preferably 1 to 50; "f" is an integer of 0 to 200, preferably 0 to 100; and "g" is an integer of 0 to 200, preferably 0 to 100.

The urethane-(meth)acrylate compound shown by the general formula (2) can be obtained by a method of reacting a polyether compound having hydroxy groups at the both ends with (meth)acrylate compounds each having an isocyanate group; a method of reacting a polyester compound having hydroxy groups at the both ends with (meth)acrylate compounds each having an isocyanate group; a method of reacting a polycarbonate compound having hydroxy groups at the both ends with (meth)acrylate compounds each having an isocyanate group; etc. In this case, it is also possible to use a diisocyanate compound or a dihydroxy compound as a chain extender.

As the isocyanate compounds used at this stage, the following can be exemplified.

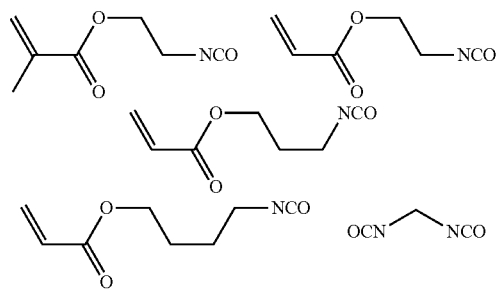

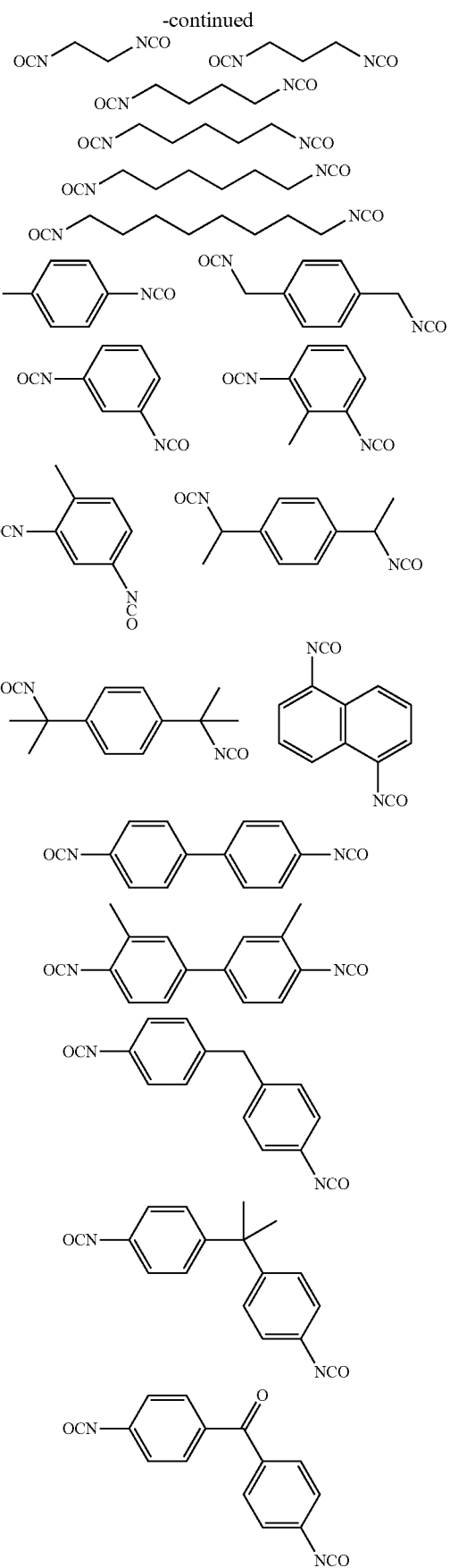

-continued

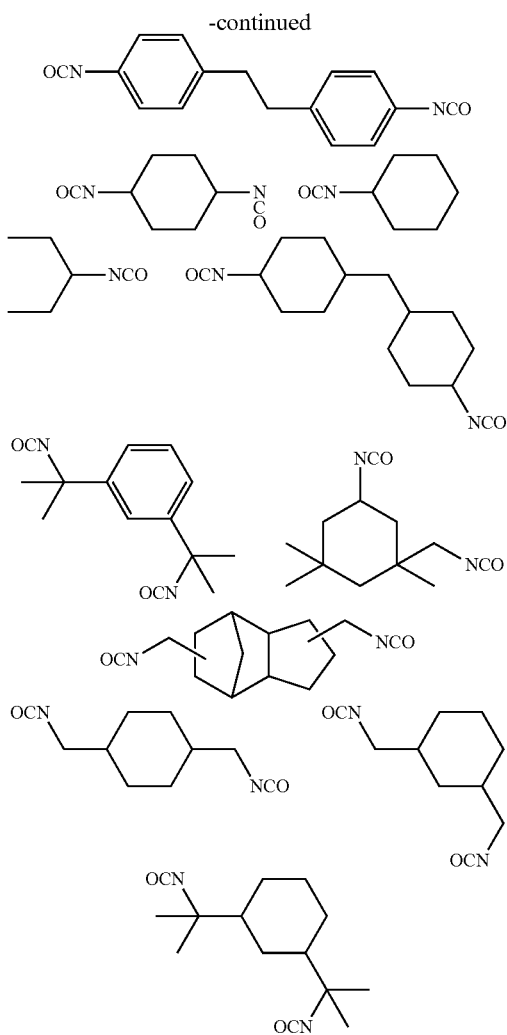

[(C) Organic Solvent Having Boiling Point in the Range of 115 to 200° C. at Atmospheric Pressure]

The composition for forming the inventive stretchable film contains an organic solvent having a boiling point in the range of 115 to 200° C. at atmospheric pressure as a component (C).

As such a component (C), specifically, it is preferable to use one or more organic solvents selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, and propylene glycol monoethyl ether acetate.

As will be described below, when forming the stretchable film, the component (C) is evaporated from the film surface by heating after the composition is applied on a substrate, for example. At this stage, the component (A) moves to the film surface side accompanying with moving of the component (C) to the film surface side to form a structure in which the component (A) is localized in the direction of the surface of the film. Accordingly, when the boiling point of the component (C) is below 115° C. at atmospheric pressure, the component (C) evaporates to solidify the coated film of the composition before the component (A) moves to the film surface side, which fails to localize sufficient amount of the component (A) to the film surface side. On the other hand, when the boiling point of the component (C) is above 200° C. at atmospheric pressure, the component (C) fail to evaporate sufficiently, which cause to remain a large amount of the component (C) in the stretchable film. The use of such a stretchable film as a stretchable film for a wearable device, e.g., a living body sensor, raises the risk to generate skin allergies due to gradual evaporation of the remaining solvent.

The component (C) is preferably an organic solvent without a polymerizable double bond (i.e., non crosslinkable organic solvent). Such an organic solvent can prevent crosslinking of the organic solvent having polymerizable double bond disposed on the film surface, which fails to cover the film surface with silicone-(meth)acrylate, to lower the repellency.

The amount of the component (C) to be added is preferably in the range of 5 to 1,000 parts by mass, more preferably 10 to 500 parts by mass, particularly 20 to 300 parts by mass, based on 100 parts by mass of the solid contents in the composition.

[Additives]

To cure the component (A) and the component (B), it is possible to add a radical generator, which generate a radical by light or heat. As will be described below, in the inventive method for forming a stretchable film, the component (A) is moved (localized) to the film surface side while evaporating the component (C) by heating. In this heating for evaporating the component (C), it is preferable not to cure the component (A) and the component (B) since the component (A) is easy to move to the film surface. Accordingly, it is preferable to add a photo-radical generator to the composition to cure the component (A) and the component (B) by light irradiation after heating.

Illustrative examples of the photoradical generator include acetophenone, 4,4'-dimethoxybenzyl, benzyl, benzoin, benzophenone, 2-benzoylbenzoic acid, 4,4'-bis(dimethylamino)benzophenone, 4,4'-bis(diethylamino)benzophenone, benzoin methyl ether, benzoin ethyl ether, benzoin isopropyl ether, benzoin butyl ether, benzoin isobutyl ether, 4-benzoylbenzoic acid, 2,2'-bis(2-chlorophenyl)-4,4',5,5'-tetraphenyl-1,2'-biimidazole, methyl 2-benzoylbenzoate, 2-(1,3-benzodioxole-5-yle)-4,6-bis(trichloromethyl)-1,3,5-triazine, 2-benzyl-2-(dimethylamino)-4'-morpholinobutylophenone, 4,4'-dichlorobenzophenone, 2,2-diethoxyacetophenone, 2,2-dimethoxy-2-phenylacetophenone, 2,4-diethylthioxanthen-9-one, diphenyl(2,4,6-trimethylbenzoyl)phosphine oxide, 1,4-dibenzoylbenzene, 2-ethylanthraquinone, 1-hydroxycyclohexyl phenyl ketone, 2-hydroxy-2-methylpropiophenone, 2-hydroxy-4'-(2-hydroxyethoxy)-2-methylpropiophenone, 2-isonitrosopropiophenone, and 2-phenyl-2-(p-toluenesulfonyloxy)acetophenone (BAPO). The loading amount of the photoradical generator is preferably in a range of 0.1 to 50 parts by mass on the basis of total 100 parts by mass of the component (A) and the component (B).

As other additives, a thiol base crosslinking agent can be added. This makes it possible to improve the efficiency of radical crosslinking.

The inventive stretchable film is a stretchable film comprising the both of the component (A) with excellent repellency and the component (B) with excellent stretchability and strength, in which the component (A) with excellent repellency is localized in the direction of the film surface (on the one side). Such a structure allows the stretchable film to have excellent stretchability and strength equal to those of polyurethane due to the component (B), and to have a surface with excellent repellency equals to that of silicone due to the component (A) localized in the direction of the film surface.

Figure 1B:
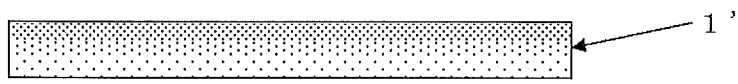
FIG. 1B is a schematic drawing showing an example of the inventive stretchable film removed (independent) from a substrate.

An example of the inventive stretchable film is shown in FIGS. 1A and 1B. The stretchable film 1 in FIG. 1A is formed on the substrate 2. This stretchable film 1 is a cured product of the composition containing the components (A) to (C) described above, in which the component (A) is localized in the direction of the film surface. The stretchable film 1' in FIG. 1B is the one in which the substrate 2 is removed from the stretchable film 1 formed on the substrate 2 in FIG. 1A. As described above, the inventive stretchable film may be a stretchable film formed on a substrate, etc. or may be an independent stretchable film. Incidentally, FIGS. 1A and 1B shows the distribution of the component (A) schematically with light and shade, in which the component (A) is localized in the direction of the film surface having darker shade.

The inventive stretchable film described above can be a stretchable film that has excellent stretchability and strength equals to those of polyurethane, with the film surface having excellent repellency equals to that of silicone. It is free from the risk of peeling of silicone on the film surface to lower the repellency, unlike the one having silicone bred out to the surface, because of crosslinking of (A) the (meth)acrylate compound having a siloxane bond localized in the direction of the film surface.

<Method for Forming Stretchable Film>

The present invention also provides a method for forming a stretchable film comprising:

applying a composition which contains (A) a (meth)acrylate compound having a siloxane bond, (B) a (meth)acrylate compound other than the component (A) having a urethane bond, and (C) an organic solvent having a boiling point in the range of 115 to 200° C. at atmospheric pressure onto a substrate;

evaporating the component (C) by heating, while localizing the component (A) in the direction of a surface of the film; and thereafter curing the component (A) and the component (B) by light irradiation.

As the composition, it is possible to use the same ones mentioned in the explanations of the stretchable film described above.

When the cured film have to be removed temporarily from the substrate later, it is preferable to use a substrate with higher release properties as the substrate, particularly a substrate on which the surface is coated with a resin having lower surface energy such as fluorine resin including Teflon (registered trade mark) and tetrafluoroethylene-perfluoroalkylvinylether copolymer (PFA), polyethylene, and polypropylene.

The method for applying the composition onto the substrate includes spin coating, bar coating, roll coating, flow coating, dip coating, spray coating, and doctor coating. The coating is preferably performed so as to have a coating film thickness of 1 μm to 2 mm.

The heating after applying the composition onto a substrate can be performed with a hot plate, in an oven, or by irradiation of far infrared ray, for example. The heating condition is preferably at 30 to 150° C. for 10 seconds to 30 minutes, more preferably 50 to 120° C. for 30 seconds to 20 minutes. The baking may be performed in any environment such as in the atmosphere, in an inert gas, or in vacuum.

Through this heating, the component (C) moves from the inside of the coating film of the composition to the direction of the film surface to evaporate out of the film surface. This causes moving of the component (A) to the direction of the film surface at this stage. When the boiling point of the component (C) is below 115° C., the component (C) is completely evaporated to solidify the coating film of the composition before the component (A) starts to move to the direction of the film surface, which lowers the ratio of the component (A) localized in the direction of the film surface. As a result, it becomes impossible to obtain sufficient repellency. On the other hand, when the boiling point of the component (C) is above 200° C., the component (C) is hard to evaporate, which makes the coating film of the composition be difficult to solidify, and not only that, the component (C) be apt to remain in the cured stretchable film in a large amount. The remaining of large amount of the component (C) has a risk of irritant to skin by gradual evaporation of the remained component (C), which is not preferable in parts of a wearable device to be in contact with skin.

The light irradiation after the heating is preferably performed with a light having a wavelength of 200 to 500 nm. As the light source, a halogen lamp, a xenon lamp, excimer laser, and LED can be used, for example. Irradiation with electron beam is also preferable. The irradiation quantity is preferably in the range of 1 mJ/cm$^2$ to 100 J/cm$^2$. This gives rise to a crosslinking reaction of the component (A) and the component (B) to cure the coating film of the composition to form a stretchable film.

Figure 2A:
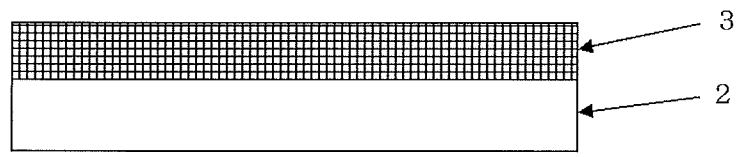
FIGS. 2A to 2D are a flow diagram showing an example of the inventive method for forming a stretchable film.
Figure 2B:
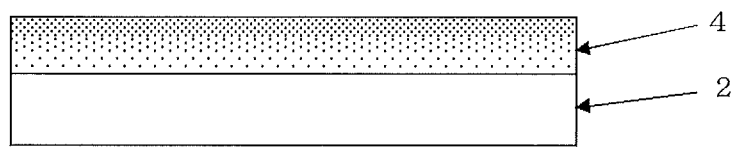
Figure 2C:
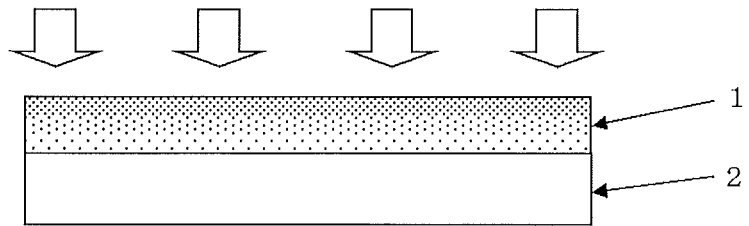
Figure 2D:
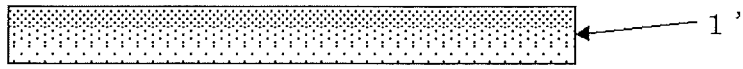

A flow diagram of an example of the inventive method for forming a stretchable film is shown in FIGS. 2A to 2D. In the method for forming a stretchable film shown in FIGS. 2A to 2D, the composition which contains the (A) to (C) described above is applied first onto the substrate 2 to form the coating film 3 of the composition (FIG. 2A). Then, the component (C) is evaporated by heating, while localizing the component (A) in the direction of the surface of the film to form the coated film 4 in which the component (A) is localized (FIG. 2B). Subsequently, the component (A) and the component (B) are cured by light irradiation to form the stretchable film 1 (FIG. 2C). It is to be noted that the stretchable film 1 may also be removed from the substrate 2 to form the independent stretchable film 1' in accordance with needs (FIG. 2D).

The inventive method for forming a stretchable film described above can easily form a stretchable film that has excellent stretchability and strength equal to those of polyurethane, with the film surface having excellent repellency equal to that of silicone.

<Stretchable Wiring Film>

The present invention also provides a stretchable wiring film, comprising a conductive wiring having stretchability, the both sides of the conductive wiring being coated with the inventive stretchable film described above; wherein the surface localizing the component (A) of the stretchable film is disposed on the outside, and the conductive wiring is disposed on the inside.

As the conductive wiring having stretchability, which is not particularly limited, silver wiring can be suitably used, for example.

Such a stretchable wiring film of the present invention is also excellent in repellency on the surface not only excellent in stretchability and strength. Accordingly, the inventive stretchable wiring film can be suitably used as a wiring unit to connect the bio-electrode and the sensor in a wearable device.

<Method for Manufacturing Stretchable Wiring Film: Method A>

The present invention also provides a method for manufacturing a stretchable wiring film, comprising: sandwiching a conductive wiring having stretchability between two stretchable films of the present invention described above, with the surface where the component (A) localizes being disposed on the outside; and laminating the conductive wiring and the stretchable films by heating and pressing to coat the both sides of the conductive wiring. Hereinafter, this method is referred to as Method A.

As the conductive wiring having stretchability, it is possible to use the same ones mentioned in the explanation of the stretchable wiring film described above.

Figure 3A:
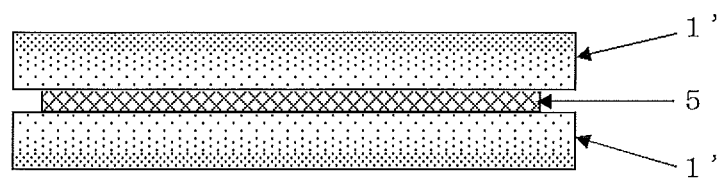
FIGS. 3A to 3C are a flow diagram showing an example of the inventive method for manufacturing a stretchable wiring film (Method A)
Figure 3B:
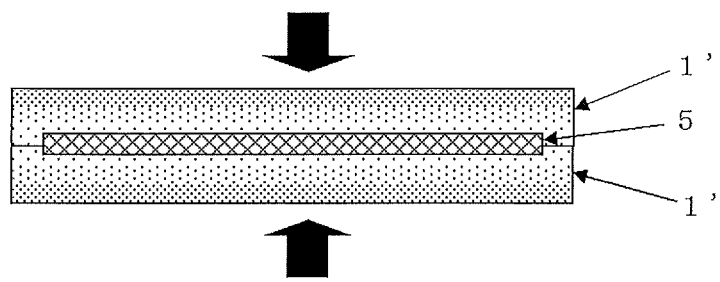
Figure 3C:
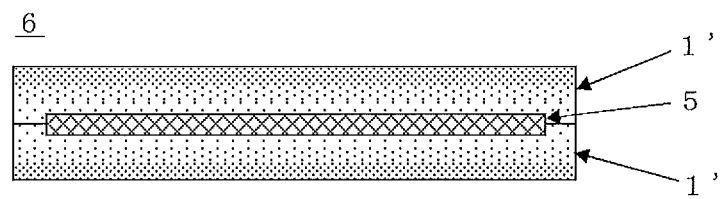

A flow diagram of an example of the inventive method for manufacturing a stretchable wiring film (Method A) is shown in FIG. 3A to 3C. In Method A shown in FIG. 3 3A to 3C, the conductive wiring 5 having stretchability is sandwiched between the two stretchable films 1', with the surface of the stretchable film 1' where the component (A) localizes being disposed on the outside (FIG. 3A). Then, this is laminated by heating and pressing (FIG. 3B). In this manner, the stretchable wiring film 6 in which the both sides of the conductive wiring 5 are coated with the stretchable films 1' is manufactured (FIG. 3C).

Figure 4A:
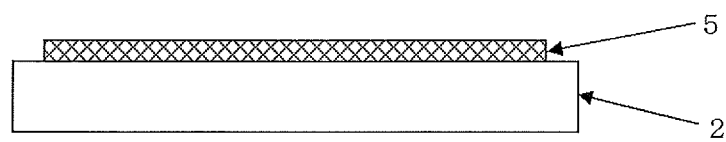
FIGS. 4A to 4D are a flow diagram showing another example of the inventive method for manufacturing a stretchable wiring film.
Figure 4B:
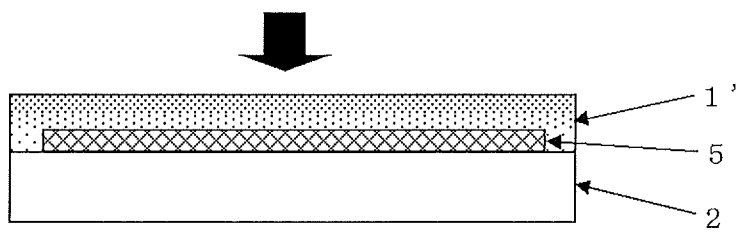
Figure 4C:
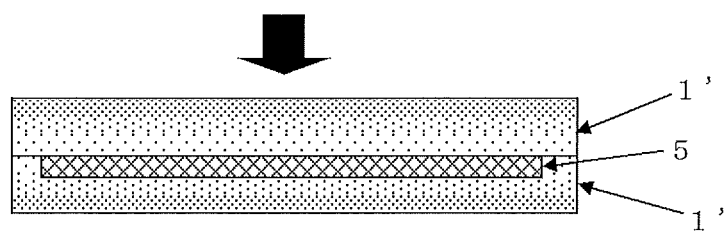
Figure 4D:
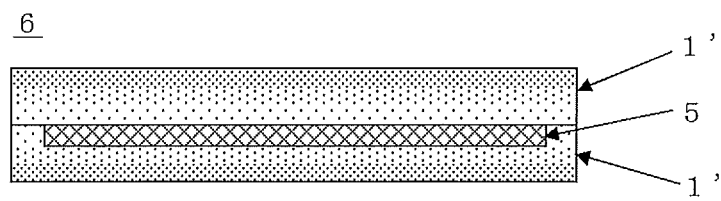

The inventive method for manufacturing a stretchable wiring film may also be a method shown in FIGS. 4A to 4D. In the method shown in FIG. 4A to 4D, the conductive wiring 5 having stretchability is put onto the substrate 2, at first (FIG. 4A). Then, one side of the conductive wiring 5 is laminated by heating and pressing such that the surface of the stretchable film 1' where the component (A) is localized is disposed on the outside (FIG. 4B). After removing the substrate 2, the opposite side of the conductive wiring 5 is laminated by heating and pressing such that the surface of the stretchable film 1' where the component (A) is localized is disposed on the outside (FIG. 4C). In this manner, the stretchable wiring film 6 in which the both sides of the conductive wiring 5 are coated with the stretchable films 1' is manufactured (FIG. 4D).

In such a method, the stretchable wiring film can also be easily manufactured by lamination using the inventive stretchable film. The method A, however, can perform the laminate processing of FIG. 4B and FIG. 4C at once, which can simplify the lamination step, and is more preferable.

The lamination is a convenient method to cover the central part with a film-shape resin by heating and pressing, with the resin being adapted to the shape of the central part, and is utilized in many fields. When forming a film only from silicone resin, it has been impossible to form an independent film (sheet) because of the lower strength. In the inventive stretchable film, however, it is possible to make the most part of the film component be urethane resin with higher strength and stretchability (the component (B)), and the quite small portion on the surface side be silicone resin (the component (A)), which makes it possible to form a film having excellent strength equals to that of urethane resin. Accordingly, this can be an independent film removed from the substrate, and can be applied to laminate processing.

The temperature at the laminate processing is not particularly limited, but is preferably about 50 to 150° C.

The pressure at the laminate processing is not particularly limited, but is preferably about 0.1 to 10 kg/cm$^2$.

<Method for Manufacturing Coated Wiring Substrate>

The present invention provides a method for manufacturing a coated wiring substrate having a single-side-coated conductive wiring, comprising:

putting a conductive wiring having stretchability onto a substrate;

applying a composition which contains (A) a (meth)acrylate compound having a siloxane bond, (B) a (meth)acrylate compound other than the component (A) having a urethane bond, and (C) an organic solvent having a boiling point in the range of 115 to 200° C. at atmospheric pressure onto the substrate having the conductive wiring thereon;

evaporating the component (C) by heating, while localizing the component (A) in the direction of a surface of the film; and thereafter curing the component (A) and the component (B) by light irradiation to form a stretchable film.

As the component, it is possible to use the same ones mentioned in the explanation of the stretchable film described above. As the substrate, it is possible to use the same ones mentioned in the explanation of the method for forming a stretchable film described above. As the conductive wiring having stretchability, it is possible to use the same ones mentioned in the explanation of the stretchable wiring film described above.

The heating condition when evaporating the component (C) and the condition of the light irradiation when curing the component (A) and the component (B) can be the same as the conditions mentioned in the explanation of the method for forming a stretchable film described above.

Figure 5A:
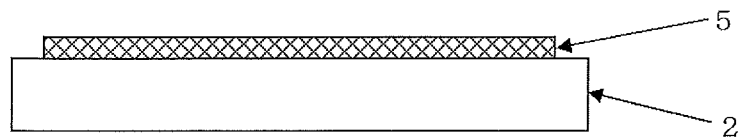
FIGS. 5A to 5E are a flow diagram showing an example of the inventive method for manufacturing a coated wiring substrate.
Figure 5B:
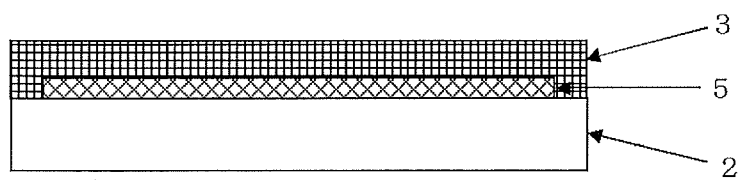
Figure 5C:
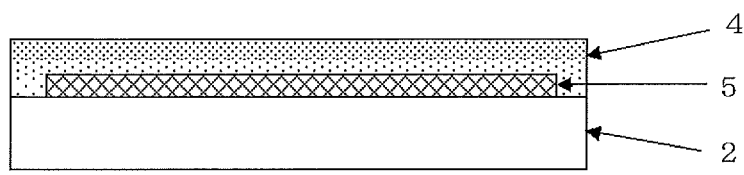
Figure 5D:
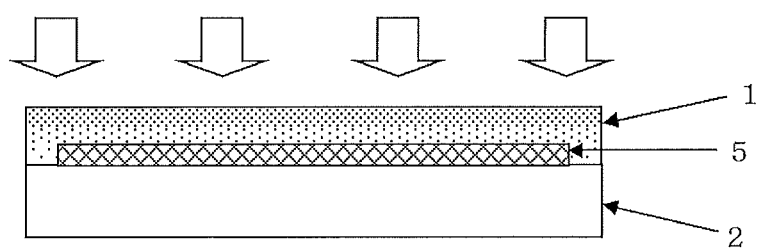
Figure 5E:
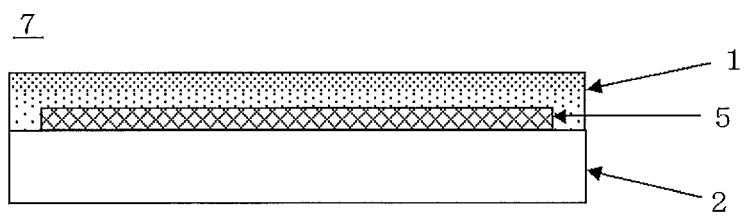

A flow diagram of an example of the inventive method for manufacturing a coated wiring substrate is shown in FIGS. 5A to 5E. In the method for manufacturing a coated wiring substrate shown in FIGS. 5A to 5E, the conductive wiring 5 having stretchability is put on the substrate 2, at first (FIG. 5A). Then, the composition which contains the components (A) to (C) described above is applied onto this to form the coating film 3 of the composition (FIG. 5B). Subsequently, the component (C) is evaporated by heating, while localizing the component (A) in the direction of the surface of the film to form the coated film 4 in which the component (A) is localized (FIG. 5C). Then, the component (A) and the component (B) are cured by light irradiation to form the stretchable film 1 (FIG. 5D). In this manner, the coated wiring substrate 7 in which one side of the conductive wiring 5 on the substrate 2 is coated with the stretchable film 1 is manufactured (FIG. 5E).

Such a manufacturing method makes it possible to easily manufacture a coated wiring substrate in which one side of the conductive wiring is coated with the inventive stretchable film, which has excellent stretchability and strength, with the film surface being excellent in repellency. The coated wiring substrate thus formed can be suitably used for manufacturing a stretchable wiring film.

<Method for Manufacturing Stretchable Wiring Film: Method B>

The present invention also provides a method for manufacturing a stretchable wiring film having a double-side-coated conductive wiring, comprising:

removing the single-side-coated conductive wiring temporarily from the substrate of the coated wiring substrate manufactured by the method described above;

putting the single-side-coated conductive wiring onto the substrate, with the coated side being downward;

applying a composition which contains the component (A), the component (B), and the component (C) onto the substrate having the single-side-coated conductive wiring thereon;

evaporating the component (C) by heating, while localizing the component (A) in the direction of a surface of the film; and thereafter curing the component (A) and the component (B) by light irradiation to form a stretchable film.

As the composition, it is possible to use the same ones mentioned in the explanation of the stretchable film described above.

The heating condition when evaporating the component (C) and the condition of the light irradiation when curing the component (A) and the component (B) can be the same as the conditions mentioned in the explanation of the method for forming a stretchable film described above.

Figure 6A:
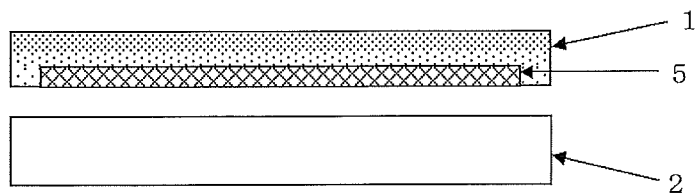
FIGS. 6A to 6F are a flow diagram showing an example of the inventive method for manufacturing a stretchable wiring film (Method B).
Figure 6B:
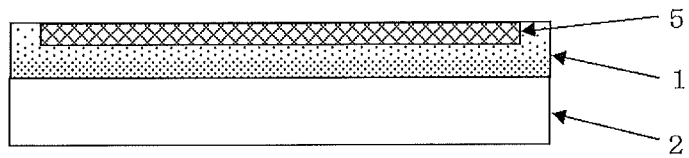
Figure 6C:
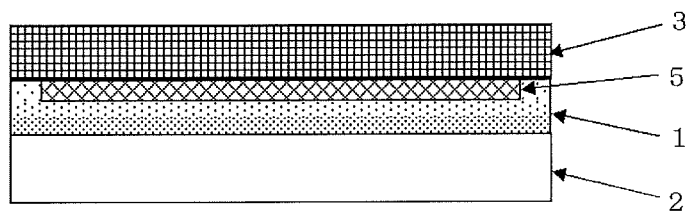
Figure 6D:
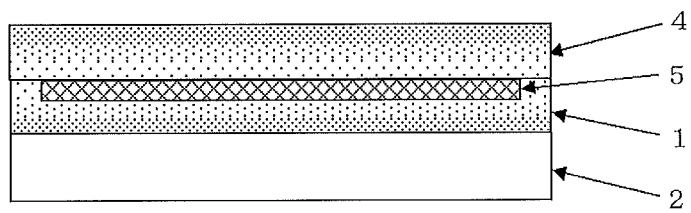
Figure 6E:
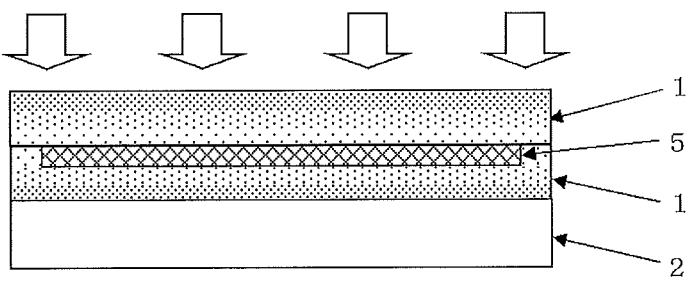
Figure 6F:
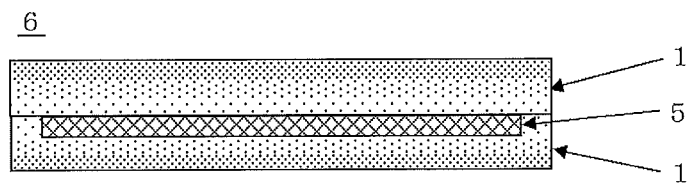

A flow diagram of an example of the inventive method for manufacturing a stretchable wiring film (Method B) is shown in FIGS. 6A to 6F. In Method B shown in FIGS. 6A to 6F, the conductive wiring 5 in which one side thereof is coated with the stretchable film 1 is removed temporarily from the substrate 2 of the coated wiring substrate 7 manufactured by the method shown in FIGS. 5A to 5E (FIG. 6A). Then, this was put on the substrate 2, with the coated surface (i.e., the side of the stretchable film 1) being downward (FIG. 6B). Subsequently, the composition which contains the components (A) to (C) described above is applied onto this to form the coating film 3 of the composition (FIG. 6C). Then, the component (C) is evaporated by heating, while localizing the component (A) in the direction of the surface of the film to form the coated film 4 in which the component (A) is localized (FIG. 6D). Subsequently, the component (A) and the component (B) are cured by light irradiation to form the stretchable film 1 (FIG. 6E). In this manner, the stretchable wiring film 6 in which the both sides of the conductive wiring 5 are coated with the stretchable film 1 is manufactured (FIG. 6F).

Such a manufacturing method, coating the both sides of a conductive wiring with the inventive stretchable films, makes it possible to easily manufacture a stretchable wiring film that is also excellent in repellency on the surface not only excellent in stretchability and strength.

EXAMPLES

Hereinafter, the present invention will be specifically described with reference to Examples and Comparative Examples, but the present invention is not limited thereto. Incidentally, the weight average molecular weight (Mw) represents a weight average molecular weight in terms of polystyrene determined by gel permeation chromatography (GPC).

The following are Silicone-(meth)acrylates-1 to 15 each blended to a composition for forming a stretchable film as the component (A).

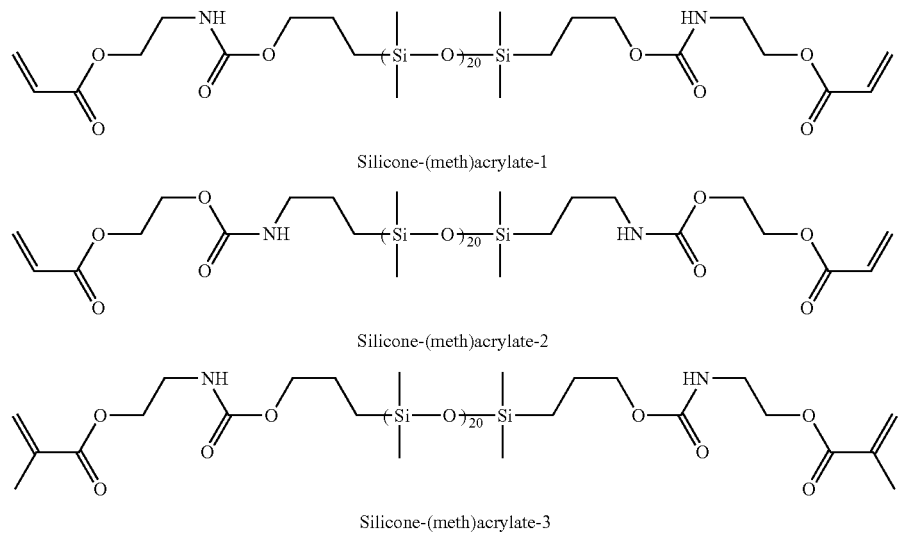

Silicone-(meth)acrylate-1

Silicone-(meth)acrylate-2

Silicone-(meth)acrylate-3

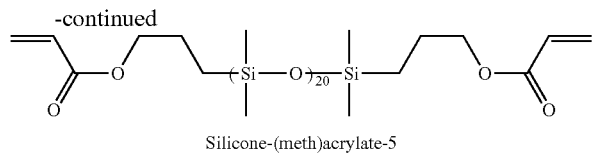
Silicone-(meth)acrylate-5
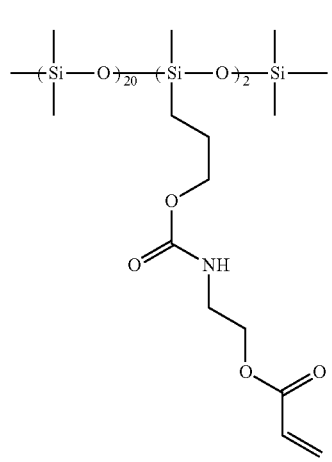
Silicone-(meth)acrylate-4
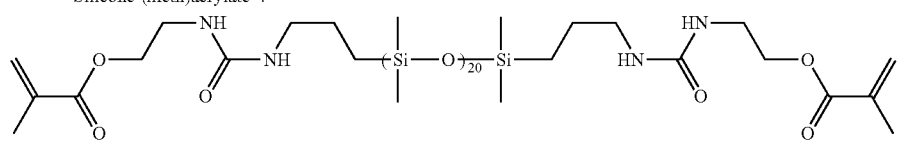
Silicone-(meth)acrylate-6
In the formulae, the numbers of repeating units are average values.
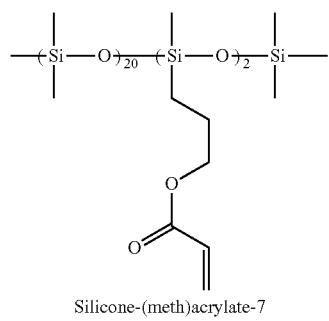
Silicone-(meth)acrylate-7
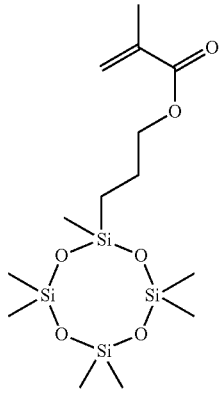
Silicone-(meth)acrylate-10
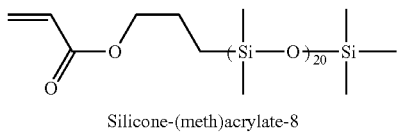
Silicone-(meth)acrylate-8
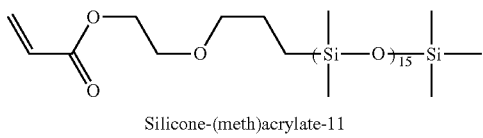
Silicone-(meth)acrylate-11
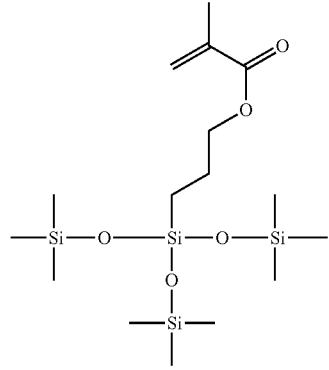
Silicone-(meth)acrylate-9
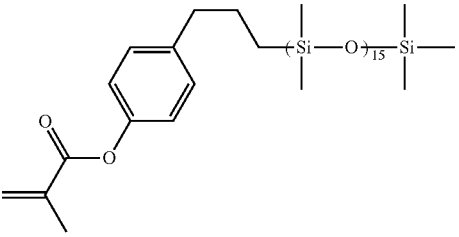
Silicone-(meth)acrylate-12
In the formulae, the numbers of repeating units are average values.

Silicone-(meth)acrylate-13

Silicone-(meth)acrylate-14

Silicone-(meth)acrylate-15

In the formulae, the numbers of repeating units are average values.

Silicone-(Meth)Acrylate-1:
  Molecular weight (Mw)=1,940, Dispersity (Mw/Mn)=1.8
Silicone-(Meth)Acrylate-2:
  Molecular weight (Mw)=1,980, Dispersity (Mw/Mn)=1.6
Silicone-(Meth)Acrylate-3:
  Molecular weight (Mw)=1,970, Dispersity (Mw/Mn)=1.6
Silicone-(Meth)Acrylate-4:
  Molecular weight (Mw)=1,840, Dispersity (Mw/Mn)=1.9
Silicone-(Meth)Acrylate-5:
  Molecular weight (Mw)=1,760, Dispersity (Mw/Mn)=1.6
Silicone-(Meth)Acrylate-6:
  Molecular weight (Mw)=2,010, Dispersity (Mw/Mn)=1.5
Silicone-(Meth)Acrylate-7:
  Molecular weight (Mw)=1,950, Dispersity (Mw/Mn)=1.8
Silicone-(Meth)Acrylate-8:
  Molecular weight (Mw)=1,600, Dispersity (Mw/Mn)=1.6
Silicone-(Meth)Acrylate-9:
  Molecular weight (formula weight)=422
Silicone-(Meth)Acrylate-10:
  Molecular weight (formula weight)=408
Silicone-(Meth)Acrylate-11:
  Molecular weight (Mw)=1,350, Dispersity (Mw/Mn)=1.5
Silicone-(Meth)Acrylate-12:
  Molecular weight (Mw)=1,400, Dispersity (Mw/Mn)=1.4
Silicone-(Meth)Acrylate-13:
  Molecular weight (formula weight)=860
Silicone-(Meth)Acrylate-14:
  Molecular weight (Mw)=1,800, Dispersity (Mw/Mn)=1.5
Silicone-(Meth)Acrylate-15:
  Molecular weight (Mw)=1,600, Dispersity (Mw/Mn)=1.6

The following are Urethane-(meth)acrylates-1 to 14 each blended to a composition for forming a stretchable film as the component (B).

Urethane-(meth)acrylate-1

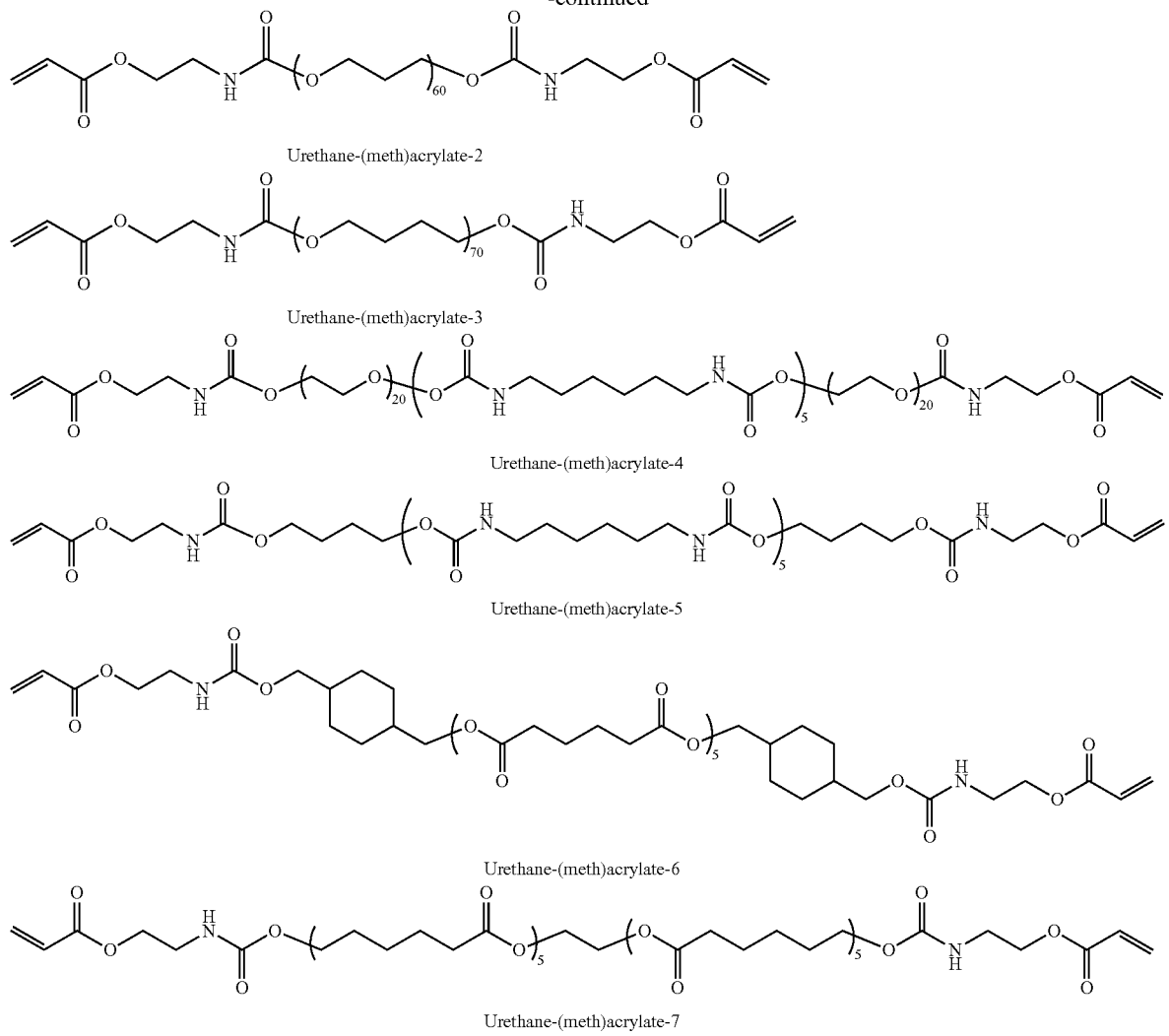
In the formulae, the numbers of repeating units are average values.
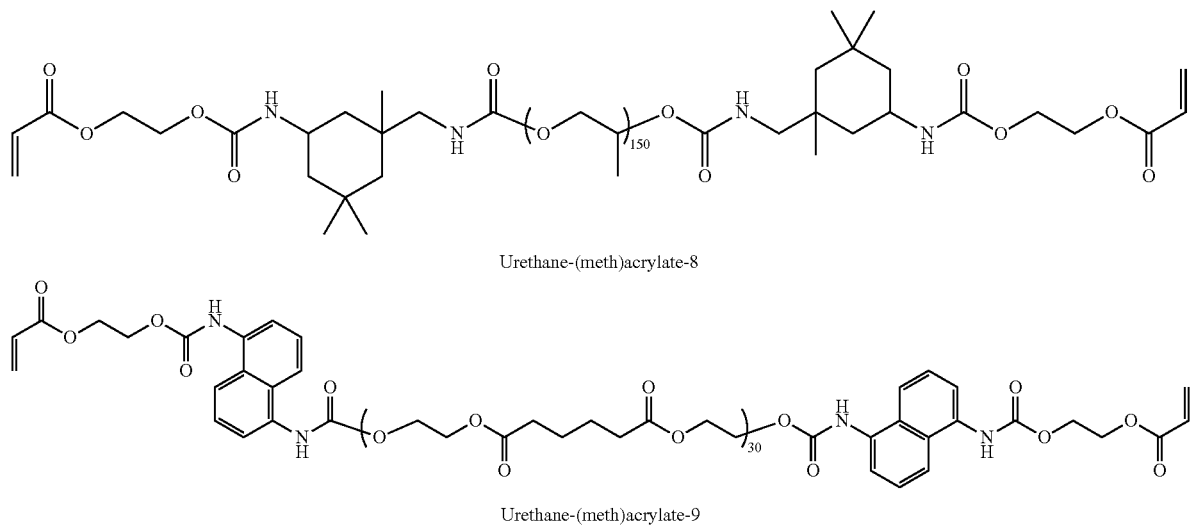

-continued

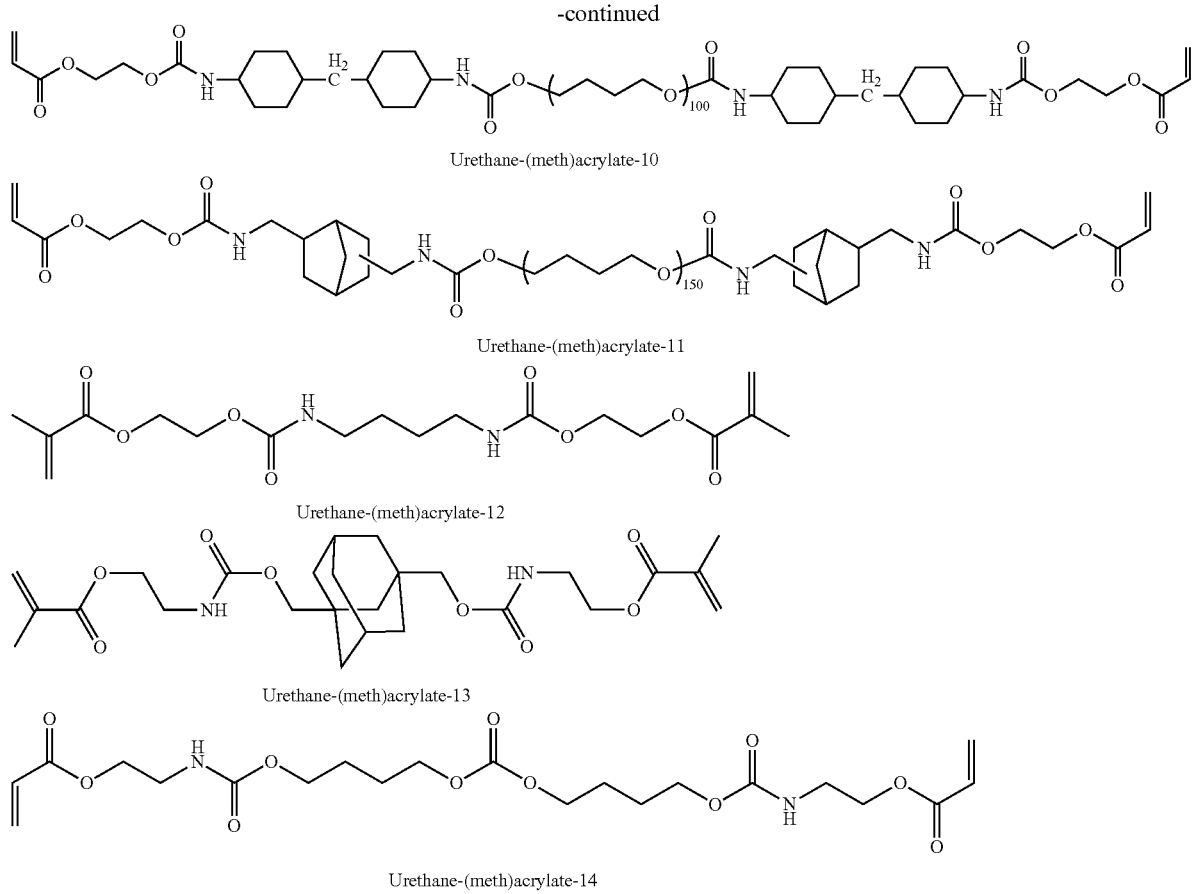

Urethane-(meth)acrylate-10

Urethane-(meth)acrylate-11

Urethane-(meth)acrylate-12

Urethane-(meth)acrylate-13

Urethane-(meth)acrylate-14

In the formulae, the numbers of repeating units are average values.

Urethane-(Meth)Acrylate-1:
  Molecular weight (Mw)=2,600, Dispersity (Mw/Mn)=1.8
Urethane-(Meth)Acrylate-2:
  Molecular weight (Mw)=3,800, Dispersity (Mw/Mn)=1.7
Urethane-(Meth)Acrylate-3:
  Molecular weight (Mw)=5,400, Dispersity (Mw/Mn)=1.9
Urethane-(Meth)Acrylate-4:
  Molecular weight (Mw)=3,100, Dispersity (Mw/Mn)=2.2
Urethane-(Meth)Acrylate-5:
  Molecular weight (Mw)=1,450, Dispersity (Mw/Mn)=1.9
Urethane-(Meth)Acrylate-6:
  Molecular weight (Mw)=1,980, Dispersity (Mw/Mn)=1.9
Urethane-(Meth)Acrylate-7:
  Molecular weight (Mw)=1,480, Dispersity (Mw/Mn)=1.8
Urethane-(Meth)Acrylate-8:
  Molecular weight (Mw)=9,400, Dispersity (Mw/Mn)=2.1
Urethane-(Meth)Acrylate-9:
  Molecular weight (Mw)=6,750, Dispersity (Mw/Mn)=1.8
Urethane-(Meth)Acrylate-10:
  Molecular weight (Mw)=8,100, Dispersity (Mw/Mn)=2.5
Urethane-(Meth)Acrylate-11:
  Molecular weight (Mw)=11,500, Dispersity (Mw/Mn)=2.6
Urethane-(Meth)Acrylate-12:
  Molecular weight (formula weight)=400
Urethane-(Meth)Acrylate-13:
  Molecular weight (formula weight)=506
Urethane-(Meth)Acrylate-14:
  Molecular weight (formula weight)=488

The following are Photo-radical generators-1 to 3 each blended to a composition for forming a stretchable film as an additive.
Photo-radical generators-1: 4,4'-dimethoxybenzyl
Photo-radical generators-2: 2,2-diethoxyacetophenone
Photo-radical generators-3: 2,2-dimethoxy-2-phenylacetophenone The following are organic solvents blended to a composition for forming a stretchable film as the component (C) or the replacements and their boiling points at atmospheric pressure.
2-heptanone: 151° C.
2-octanone: 173° C.
cyclohexanone: 156° C.
amyl acetate: 149° C.
isoamyl acetate: 142° C.
butyl acetate: 126° C.
PGMEA (propylene glycol monomethyl ether acetate): 146° C.
PGME (propylene glycol monomethyl ether): 120° C.
ethanol: 78° C.
2-ethylhexyl acrylate: 214° C.
1-vinyl-2-pyrrolidone: 90° C.

Examples 1 to 16 and Comparative Examples 1 to 4

Silicone-(meth)acrylates-1 to 15, Urethane-(meth)acrylates-1 to 14, Photo-radical generators-1 to 3, and organic solvents were blended in each formulation described in Table 1 to prepare compositions for forming a stretchable film (Sols-1 to 16, Comparative Sols-1 to 4). Onto a substrate with the surface being coated with Teflon (registered trade mark), each prepared compositions for forming a stretchable film was applied by a bar coating method. This was baked at 110° C. for 20 minutes, and then irradiated with 1 J/cm$^2$ of light with a 1,000 W xenon lamp in a nitrogen atmosphere, thereby curing the coating film of the composition to form a stretchable film (each of Films-1 to 16, Comparative Films-1 to 4) with the thickness of 100 μm on the substrate.

TABLE 1

| Composition * | Component (A) (parts by mass) | Component (B) (parts by mass) | Photo-radical generator (parts by mass) | Organic solvent (parts by mass) |
|---|---|---|---|---|
| Sol-1 | Silicone-(meth)acrylate-1 (7) | Urethane-(meth)acrylate-1 (93) | Photo-radical generator-1 (2) | 2-heptanone (30) |
| Sol-2 | Silicone-(meth)acrylate-2 (8) | Urethane-(meth)acrylate-2 (92) | Photo-radical generator-2 (2) | 2-heptanone (30) |
| Sol-3 | Silicone-(meth)acrylate-3 (10) | Urethane-(meth)acrylate-3 (90) | Photo-radical generator-3 (2) | 2-heptanone (30) |
| Sol-4 | Silicone-(meth)acrylate-4 (10) | Urethane-(meth)acrylate-4 (90) | Photo-radical generator-3 (2) | 2-heptanone (30) |
| Sol-5 | Silicone-(meth)acrylate-1 (10) | Urethane-(meth)acrylate-5 (90) | Photo-radical generator-3 (2) | cyclohexanone (30) |
| Sol-6 | Silicone-(meth)acrylate-5 (10) | Urethane-(meth)acrylate-6 (90) | Photo-radical generator-3 (2) | amyl acetate (30) |
| Sol-7 | Silicone-(meth)acrylate-6 (20) | Urethane-(meth)acrylate-7 (80) | Photo-radical generator-3 (2) | PGMEA (30) |
| Sol-8 | Silicone-(meth)acrylate-7 (30) | Urethane-(meth)acrylate-8 (70) | Photo-radical generator-3 (2) | isoamyl acetate (30) |
| Sol-9 | Silicone-(meth)acrylate-8 (5) | Urethane-(meth)acrylate-9 (95) | Photo-radical generator-3 (2) | 2-heptanone (20) butyl acetate (10) |
| Sol-10 | Silicone-(meth)acrylate-9 (4) | Urethane-(meth)acrylate-10 (96) | Photo-radical generator-3 (2) | 2-octanone (15) PGME (15) |
| Sol-11 | Silicone-(meth)acrylate-10 (5) | Urethane-(meth)acrylate-11 (95) | Photo-radical generator-3 (2) | PGMEA (30) |
| Sol-12 | Silicone-(meth)acrylate-11 (10) | Urethane-(meth)acrylate-1 (60) Urethane-(meth)acrylate-12 (30) | Photo-radical generator-3 (2) | PGMEA (30) |
| Sol-13 | Silicone-(meth)acrylate-12 (15) | Urethane-(meth)acrylate-1 (65) Urethane-(meth)acrylate-13 (10) Urethane-(meth)acrylate-14 (10) | Photo-radical generator-3 (2) | PGMEA (30) |
| Sol-14 | Silicone-(meth)acrylate-13 (6) | Urethane-(meth)acrylate-8 (94) | Photo-radical generator-3 (2) | PGMEA (30) |
| Sol-15 | Silicone-(meth)acrylate-14 (12) | Urethane-(meth)acrylate-8 (88) | Photo-radical generator-3 (2) | PGMEA (30) |
| Sol-16 | Silicone-(meth)acrylate-15 (12) | Urethane-(meth)acrylate-8 (88) | Photo-radical generator-3 (2) | PGMEA (30) |
| Comparative Sol-1 | Silicone-(meth)acrylate-1 (100) | — | Photo-radical generator-3 (2) | 2-heptanone (30) |
| Comparative Sol-2 | — | Urethane-(meth)acrylate-1 (100) | Photo-radical generator-3 (2) | 2-heptanone (30) |
| Comparative Sol-3 | Silicone-(meth)acrylate-1 (10) | Urethane-(meth)acrylate-1 (90) | Photo-radical generator-3 (2) | ethanol (100) |
| Comparative Sol-4 | Silicone-(meth)acrylate-1 (10) | Urethane-(meth)acrylate-1 (90) | Photo-radical generator-1 (2) | 2-ethylhexyl acrylate (50) 1-vinyl-2-pyrroridone (50) |

* composition for forming a stretchable film (Measurement of Contact Angle, Stretching Property, and Strength)

The contact angle with water was measured on the surface of each stretchable film. Then, the stretchable film was removed from the substrate, and subjected to measurement of the stretching property and strength in conformity to JIS C 2151. The results are shown in Table 2.

TABLE 2

| | Stretchable film | Composition * | Contact angle (°) | Stretching property (%) | Strength (kgf/cm$^2$) |
|---|---|---|---|---|---|
| Example 1 | Film-1 | Sol-1 | 63 | 120 | 60 |
| Example 2 | Film-2 | Sol-2 | 64 | 133 | 58 |
| Example 3 | Film-3 | Sol-3 | 62 | 152 | 50 |

TABLE 2-continued

| | Stretchable film | Composition * | Contact angle (°) | Stretching property (%) | Strength (kgf/cm²) |
|---|---|---|---|---|---|
| Example 4 | Film-4 | Sol-4 | 64 | 70 | 92 |
| Example 5 | Film-5 | Sol-5 | 65 | 60 | 95 |
| Example 6 | Film-6 | Sol-6 | 63 | 91 | 80 |
| Example 7 | Film-7 | Sol-7 | 62 | 130 | 93 |
| Example 8 | Film-8 | Sol-8 | 64 | 140 | 80 |
| Example 9 | Film-9 | Sol-9 | 63 | 155 | 88 |
| Example 10 | Film-10 | Sol-10 | 64 | 105 | 92 |
| Example 11 | Film-11 | Sol-11 | 64 | 130 | 92 |
| Example 12 | Film-12 | Sol-12 | 63 | 144 | 73 |
| Example 13 | Film-13 | Sol-13 | 63 | 128 | 78 |
| Example 14 | Film-14 | Sol-14 | 63 | 160 | 83 |
| Example 15 | Film-15 | Sol-14 | 63 | 85 | 105 |
| Example 16 | Film-16 | Sol-16 | 63 | 166 | 83 |
| Comparative Example 1 | Comparative Film-1 | Comparative Sol-1 | 71 | — | — |
| Comparative Example 2 | Comparative Film-2 | Comparative Sol-2 | 50 | 85 | 80 |
| Comparative Example 3 | Comparative Film-3 | Comparative Sol-3 | 54 | 83 | 70 |
| Comparative Example 4 | Comparative Film-4 | Comparative Sol-4 | 55 | 75 | 72 |

* composition for forming a stretchable film

In Examples 1 to 16, the stretchable films (Films-1 to 16) were formed by using compositions for forming a stretchable film (Sols-1 to 16) which contained Silicone-(meth)acrylates-1 to 15 (the component (A)), Urethane-(meth)acrylates-1 to 14 (the component (B)), and the organic solvents each having a boiling point in the range of 115 to 200° C. at atmospheric pressure (the component (C)); each component (A) was localized in the direction of film surface by baking after forming the coating film of the composition while evaporating the component (C), and the component (A) and the component (B) were cured by light irradiation in this state. Consequently, as shown in Table 2, each of the obtained stretchable films had excellent stretchability and strength, together with excellent repellency on the film surface.

On the other hand, in Comparative Example 1, which formed the stretchable film (Comparative Film-1) by using the composition for forming a stretchable film (Comparative Sol-1) without the component (B), the stretchability and the strength were low since component (B) was not contained, and it failed to measure the stretching property and strength, although the repellency was excellent since the component (A) was contained. In comparative Example 2, which formed the stretchable film (Comparative Film-2) by using the composition for forming a stretchable film (Comparative Sol-2) without the component (A), the repellency was inferior to those in Examples 1 to 16 since the component (A) was not contained, although the stretchability and the strength were excellent since the component (B) was contained. In each of Comparative Examples 3 and 4, which formed the stretchable film (Comparative Film-3 or 4) by using the composition for forming a stretchable film (Comparative Sol-3 or 4) containing an organic solvent with the boiling point of below 115° C. or above 200° C. at atmospheric pressure instead of the component (C), the strength and the repellency were inferior to those in Examples 1 to 16 since the component (A) was not localized in the direction of the film surface by baking after forming the coating film of the composition.

As described above, it has revealed that the inventive stretchable film is excellent in stretchability and strength as well as repellency on the film surface, thereby having excellent properties as a film to coat a stretchable wiring used for a wearable device, etc.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A stretchable film comprising:
   a cured product of a composition which contains (A) a (meth)acrylate compound having a siloxane bond, (B) a (meth)acrylate compound other than the component (A) having a urethane bond, and (C) an organic solvent having a boiling point in the range of 115 to 200° C. at atmospheric pressure;
   wherein the component (A) is localized in the direction of a surface of the film, and
   wherein the amount of the component (C) is in the range of 20 to 300 parts by mass, based on 100 parts by mass of the solid contents in the composition.

2. The stretchable film according to claim 1, wherein the ratio of the component (A) is in the range of 1 to 35% by mass based on the total mass of solid contents in the composition excluding the component (C).

3. The stretchable film according to claim 1, wherein component (A) is a compound shown by the following general formula (1-1), (1-2), or (1-3); and the component (B) is a compound shown by the following general formula (2):

(1-1)

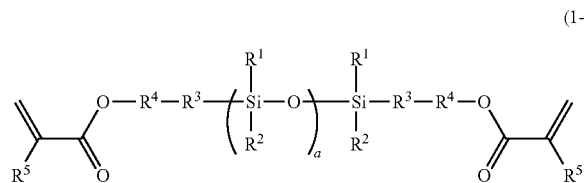

(1-2)

(1-3)

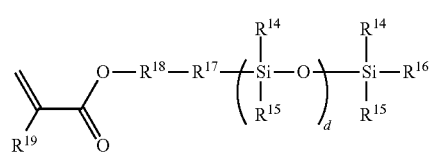

(2)

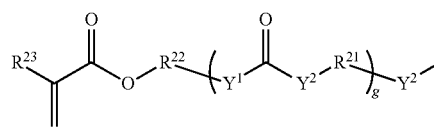

wherein $R^1$, $R^2$, $R^6$, $R^7$, $R^8$, $R^9$, $R^{14}$, $R^{15}$, and $R^{16}$ each represent a hydrogen atom, a trimethylsilyloxy group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{10}$ represents a hydrogen atom, a trimethylsilyl group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{15}$ and $R^{16}$ optionally bond with each other to form a ring, in which $R^{15}$ and $R^{16}$ form an ether group together; $R^9$ and $R^{10}$ optionally bond with each other to form a ring, in which $R^9$ and $R^{10}$ form a single bond; $R^3$, $R^{11}$, and $R^{17}$ each represent a linear, branched, or cyclic alkylene group having 3 to 30 carbon atoms optionally containing an ether group; $R^4$, $R^{12}$, and $R^{18}$ each represent a single bond, a linear, branched, or cyclic alkylene group having 1 to 20 carbon atoms, or an arylene group having 6 to 20 carbon atoms, optionally containing one or more species selected from an ether group, an ester group, a carbonate group, a carbamate group, an amide group, a urea group, a hydroxy group, and a thiourethane bond; $R^5$, $R^{13}$, $R^{19}$, and $R^{23}$ each represent a hydrogen atom or a methyl group; $R^{20}$ and $R^{22}$ each represent a single bond, a linear, branched, or cyclic alkylene group having 1 to 20 carbon atoms, an arylene group having 6 to 20 carbon atoms, or an alkenylene group having 2 to 20 carbon atoms, optionally containing one or more groups selected from an ether group, an ester group, aryl groups, and arylene groups; $R^{21}$ represents a single bond or a divalent hydrocarbon group having 1 to 15 carbon atoms; X represents a single bond, or a divalent hydrocarbon group having 1 to 12 carbon atoms optionally containing one or more groups selected from an ether group, an ester group, and a carbonate group; either $Y^1$ or $Y^2$ represents an oxygen atom and the other represents a NH group; "a" and "d" are each an integer of 1 to 100; "b" is an integer of 0 to 100, "c" is an integer of 1 to 100, and b+c is 1 to 100; "e" is an integer of 1 to 100; "f" is an integer of 0 to 200; and "g" is an integer of 0 to 200.

4. The stretchable film according to claim 2, wherein the component (A) is a compound shown by the following general formula (1-1), (1-2), or (1-3); and the component (B) is a compound shown by the following general formula (2):

(1-1)

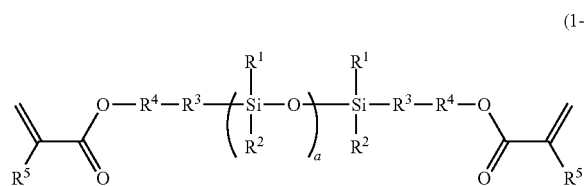

(1-2)

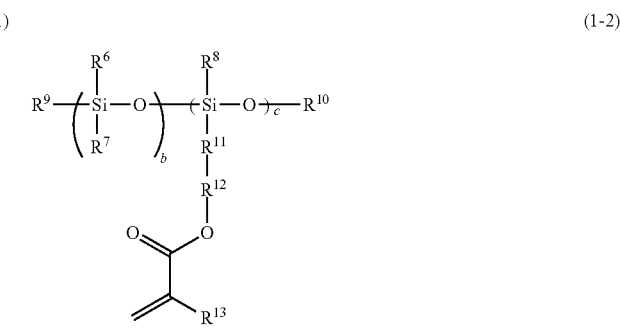

-continued (1-3)
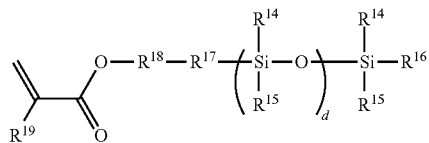

(2)
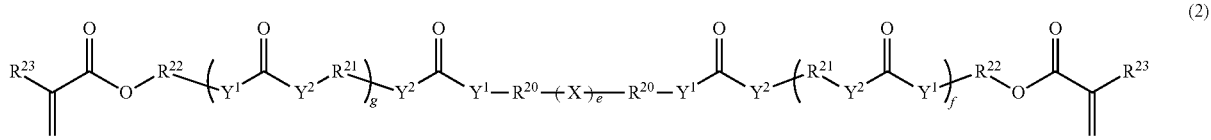

wherein $R^1$, $R^2$, $R^6$, $R^7$, $R^8$, $R^9$, $R^{14}$, $R^{15}$, and $R^{16}$ each represent a hydrogen atom, a trimethylsilyloxy group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{10}$ represents a hydrogen atom, a trimethylsilyl group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{15}$ and $R^{16}$ optionally bond with each other to form a ring, in which $R^{15}$ and $R^{16}$ form an ether group together; $R^9$ and $R^{10}$ optionally bond with each other to form a ring, in which $R^9$ and $R^{10}$ form a single bond; $R^3$, $R^{11}$, and $R^{17}$ each represent a linear, branched, or cyclic alkylene group having 3 to 30 carbon atoms optionally containing an ether group; $R^4$, $R^{12}$, and $R^{18}$ each represent a single bond, a linear, branched, or cyclic alkylene group having 1 to 20 carbon atoms, or an arylene group having 6 to 20 carbon atoms, optionally containing one or more species selected from an ether group, an ester group, a carbonate group, a carbamate group, an amide group, a urea group, a hydroxy group, and a thiourethane bond; $R^5$, $R^{13}$, $R^{19}$, and $R^{23}$ each represent a hydrogen atom or a methyl group; $R^{20}$ and $R^{22}$ each represent a single bond, a linear, branched, or cyclic alkylene group having 1 to 20 carbon atoms, an arylene group having 6 to 20 carbon atoms, or an alkenylene group having 2 to 20 carbon atoms, optionally containing one or more groups selected from an ether group, an ester group, aryl groups, and arylene groups; $R^{21}$ represents a single bond or a divalent hydrocarbon group having 1 to 15 carbon atoms; X represents a single bond, or a divalent hydrocarbon group having 1 to 12 carbon atoms optionally containing one or more groups selected from an ether group, an ester group, and a carbonate group; either $Y^1$ or $Y^2$ represents an oxygen atom and the other represents a NH group; "a" and "d" are each an integer of 1 to 100; "b" is an integer of 0 to 100, "c" is an integer of 1 to 100, and b+c is 1 to 100; "e" is an integer of 1 to 100; "f" is an integer of 0 to 200; and "g" is an integer of 0 to 200.

5. The stretchable film according to claim 1, wherein the component (C) is one or more organic solvents selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, and propylene glycol monoethyl ether acetate.

6. The stretchable film according to claim 2, wherein the component (C) is one or more organic solvents selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, and propylene glycol monoethyl ether acetate.

7. The stretchable film according to claim 1, wherein the stretchable film has a stretching property of 40 to 300% regulated by JIS C 2151.

8. The stretchable film according to claim 2, wherein the stretchable film has a stretching property of 40 to 300% regulated by JIS C 2151.

9. The stretchable film according to claim 1, wherein the stretchable film is used as a film for covering a conductive wiring having stretchability.

10. The stretchable film according to claim 2, wherein the stretchable film is used as a film for covering a conductive wiring having stretchability.

11. A method for forming a stretchable film comprising:
applying a composition which contains (A) a (meth)acrylate compound having a siloxane bond, (B) a (meth)acrylate compound other than the component (A) having a urethane bond, and (C) an organic solvent having a boiling point in the range of 115 to 200° C. at atmospheric pressure onto a substrate;
evaporating the component (C) by heating, while localizing the component (A) in the direction of a surface of the film; and thereafter
curing the component (A) and the component (B) by light irradiation,
wherein the amount of the component (C) is in the range of 20 to 300 parts by mass, based on 100 parts by mass of the solid contents in the composition.

12. The method for forming a stretchable film according to claim 11, wherein the ratio of the component (A) is in the range of 1 to 35% by mass based on the total mass of solid contents in the composition excluding the component (C).

13. The method for forming a stretchable film according to claim 11, wherein the component (A) is a compound shown by the following general formula (1-1), (1-2), or (1-3); and the component (B) is a compound shown by the following general formula (2):

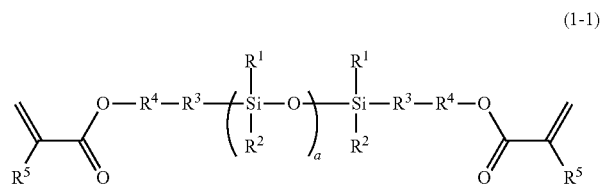
(1-1)

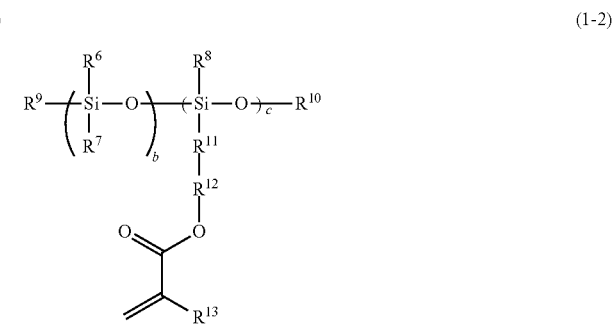
(1-2)

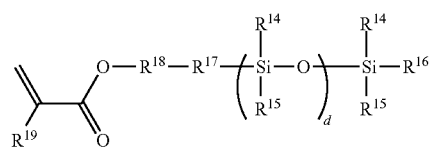
(1-3)

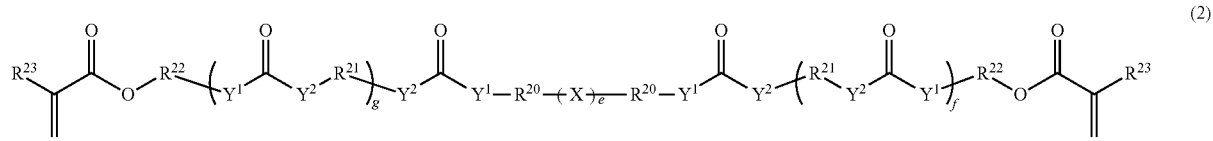
(2)

wherein $R^1$, $R^2$, $R^6$, $R^7$, $R^8$, $R^9$, $R^{14}$, $R^{15}$, and $R^{16}$ each represent a hydrogen atom, a trimethylsilyloxy group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{10}$ represents a hydrogen atom, a trimethylsilyl group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{15}$ and $R^{16}$ optionally bond with each other to form a ring, in which $R^{15}$ and $R^{16}$ form an ether group together; $R^9$ and $R^{10}$ optionally bond with each other to form a ring, in which $R^9$ and $R^{10}$ form a single bond; $R^3$, $R^{11}$, and $R^{17}$ each represent a linear, branched, or cyclic alkylene group having 3 to 30 carbon atoms optionally containing an ether group; $R^4$, $R^{12}$, and $R^{18}$ each represent a single bond, a linear, branched, or cyclic alkylene group having 1 to 20 carbon atoms, or an arylene group having 6 to 20 carbon atoms, optionally containing one or more species selected from an ether group, an ester group, a carbonate group, a carbamate group, an amide group, a urea group, a hydroxy group, and a thiourethane bond; $R^5$, $R^{13}$, $R^{19}$, and $R^{23}$ each represent a hydrogen atom or a methyl group; $R^{20}$ and $R^{22}$ each represent a single bond, a linear, branched, or cyclic alkylene group having 1 to 20 carbon atoms, an arylene group having 6 to 20 carbon atoms, or an alkenylene group having 2 to 20 carbon atoms, optionally containing one or more groups selected from an ether group, an ester group, aryl groups, and arylene groups; $R^{21}$ represents a single bond or a divalent hydrocarbon group having 1 to 15 carbon atoms; X represents a single bond, or a divalent hydrocarbon group having 1 to 12 carbon atoms optionally containing one or more groups selected from an ether group, an ester group, and a carbonate group; either $Y^1$ or $Y^2$ represents an oxygen atom and the other represents a NH group; "a" and "d" are each an integer of 1 to 100; "b" is an integer of 0 to 100, "c" is an integer of 1 to 100, and b+c is 1 to 100; "e" is an integer of 1 to 100; "f" is an integer of 0 to 200; and "g" is an integer of 0 to 200.

14. The method for forming a stretchable film according to claim 12, wherein the component (A) is a compound shown by the following general formula (1-1), (1-2), or (1-3); and the component (B) is a compound shown by the following general formula (2):

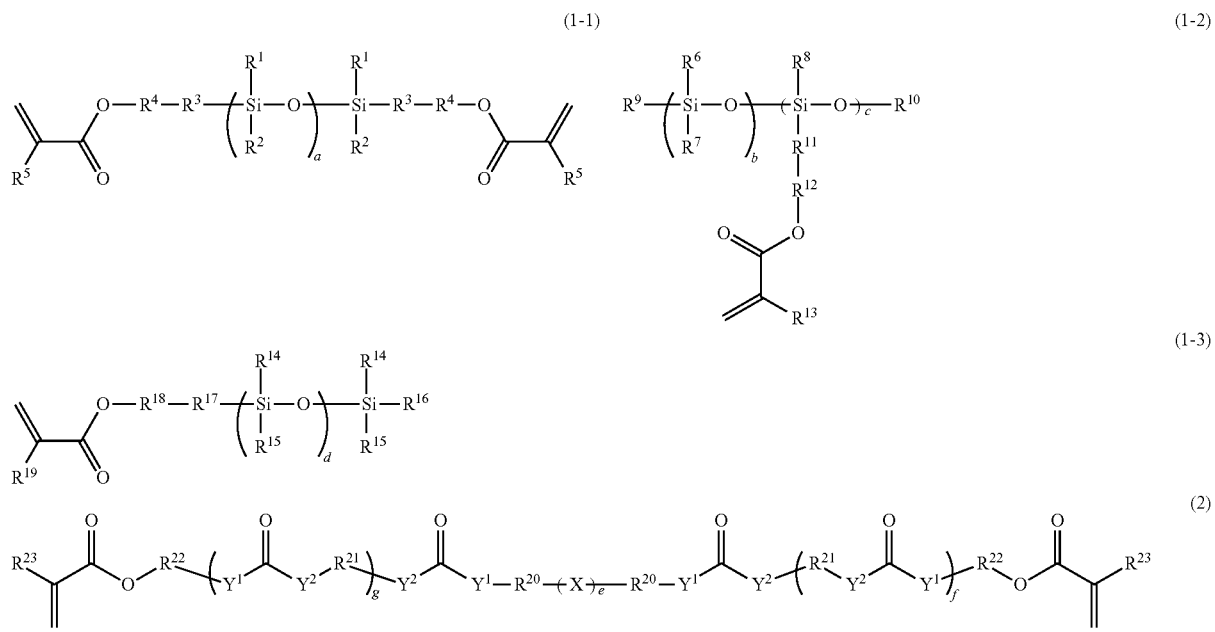

wherein $R^1$, $R^2$, $R^6$, $R^7$, $R^8$, $R^9$, $R^{14}$, $R^{15}$, and $R^{16}$ each represent a hydrogen atom, a trimethylsilyloxy group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{10}$ represents a hydrogen atom, a trimethylsilyl group, or a group selected from linear, branched, or cyclic alkyl groups having 1 to 10 carbon atoms, aryl groups having 6 to 10 carbon atoms, alkenyl groups having 2 to 10 carbon atoms, and alkynyl groups having 2 to 10 carbon atoms, optionally containing one or more species selected from a hydroxy group, alkoxy groups, an amino group, and halogen atoms; $R^{15}$ and $R^{16}$ optionally bond with each other to form a ring, in which $R^{15}$ and $R^{16}$ form an ether group together; $R^9$ and $R^{10}$ optionally bond with each other to form a ring, in which $R^9$ and $R^{10}$ form a single bond; $R^3$, $R^{11}$, and $R^{17}$ each represent a linear, branched, or cyclic alkylene group having 3 to 30 carbon atoms optionally containing an ether group; $R^4$, $R^{12}$, and $R^{18}$ each represent a single bond, a linear, branched, or cyclic alkylene group having 1 to 20 carbon atoms, or an arylene group having 6 to 20 carbon atoms, optionally containing one or more species selected from an ether group, an ester group, a carbonate group, a carbamate group, an amide group, a urea group, a hydroxy group, and a thiourethane bond; $R^5$, $R^{13}$, $R^{19}$, and $R^{23}$ each represent a hydrogen atom or a methyl group; $R^{20}$ and $R^{22}$ each represent a single bond, a linear, branched, or cyclic alkylene group having 1 to 20 carbon atoms, an arylene group having 6 to 20 carbon atoms, or an alkenylene group having 2 to 20 carbon atoms, optionally containing one or more groups selected from an ether group, an ester group, aryl groups, and arylene groups; $R^{21}$ represents a single bond or a divalent hydrocarbon group having 1 to 15 carbon atoms; X represents a single bond, or a divalent hydrocarbon group having 1 to 12 carbon atoms optionally containing one or more groups selected from an ether group, an ester group, and a carbonate group; either $Y^1$ or $Y^2$ represents an oxygen atom and the other represents a NH group; "a" and "d" are each an integer of 1 to 100; "b" is an integer of 0 to 100, "c" is an integer of 1 to 100, and b+c is 1 to 100; "e" is an integer of 1 to 100; "f" is an integer of 0 to 200; and "g" is an integer of 0 to 200.

15. The method for forming a stretchable film according to claim 11, wherein the component (C) is one or more organic solvents selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, and propylene glycol monoethyl ether acetate.

16. The method for forming a stretchable film according to claim 12, wherein the component (C) is one or more organic solvents selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, and propylene glycol monoethyl ether acetate.

17. A stretchable wiring film, comprising a conductive wiring having stretchability, the both sides of the conductive wiring being coated with the stretchable film according to claim 1; wherein the surface localizing the component (A) of the stretchable film is disposed on the outside, and the conductive wiring is disposed on the inside.

18. A method for manufacturing a stretchable wiring film, comprising:
sandwiching a conductive wiring having stretchability between two stretchable films according to claim 1, with the surface where the component (A) localizes being disposed on the outside; and
laminating the conductive wiring and the stretchable films by heating and pressing to coat the both sides of the conductive wiring.

19. A method for manufacturing a coated wiring substrate having a single-side-coated conductive wiring, comprising:
putting a conductive wiring having stretchability onto a substrate;
applying a composition which contains (A) a (meth) acrylate compound having a siloxane bond, (B) a (meth)acrylate compound other than the component (A) having a urethane bond, and (C) an organic solvent having a boiling point in the range of 115 to 200° C. at atmospheric pressure onto the substrate having the conductive wiring thereon;
evaporating the component (C) by heating, while localizing the component (A) in the direction of a surface of the film; and thereafter
curing the component (A) and the component (B) by light irradiation to form a stretchable film,
wherein the amount of the component (C) is in the range of 20 to 300 parts by mass, based on 100 parts by mass of the solid contents in the composition.

20. A method for manufacturing a stretchable wiring film having a double-side-coated conductive wiring, comprising:
removing the single-side-coated conductive wiring temporarily from the substrate of the coated wiring substrate manufactured by the method according to claim 19;
putting the single-side-coated conductive wiring onto the substrate, with the coated side being downward;
applying a composition which contains the component (A), the component (B), and the component (C) onto the substrate having the single-side-coated conductive wiring thereon;
evaporating the component (C) by heating, while localizing the component (A) in the direction of a surface of the film; and thereafter
curing the component (A) and the component (B) by light irradiation to form a stretchable film.

* * * * *